(12) United States Patent
Ting et al.

(10) Patent No.: US 12,002,854 B2
(45) Date of Patent: Jun. 4, 2024

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Heng-Wen Ting, Pingtung (TW); Kei-Wei Chen, Tainan (TW); Chii-Horng Li, Zhubei (TW); Pei-Ren Jeng, Chu-Bei (TW); Hsueh-Chang Sung, Zhubei (TW); Yen-Ru Lee, Hsinchu (TW); Chun-An Lin, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 48 days.

(21) Appl. No.: 17/520,983

(22) Filed: Nov. 8, 2021

(65) Prior Publication Data
US 2022/0059655 A1  Feb. 24, 2022

Related U.S. Application Data

(62) Division of application No. 16/548,430, filed on Aug. 22, 2019, now Pat. No. 11,171,209.

(60) Provisional application No. 62/737,698, filed on Sep. 27, 2018.

(51) Int. Cl.
*H01L 29/08* (2006.01)
*H01L 21/02* (2006.01)
*H01L 29/66* (2006.01)
*H01L 29/78* (2006.01)

(52) U.S. Cl.
CPC .... *H01L 29/0847* (2013.01); *H01L 21/02532* (2013.01); *H01L 29/66545* (2013.01); *H01L 29/6681* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,836,016 B2 | 9/2014 | Wu et al. |
| 8,841,701 B2 | 9/2014 | Lin et al. |

(Continued)

*Primary Examiner* — Khaja Ahmad
(74) *Attorney, Agent, or Firm* — Slater Matsil, LLP

(57) ABSTRACT

A semiconductor device having an improved source/drain region profile and a method for forming the same are disclosed. In an embodiment, a method includes etching one or more semiconductor fins to form one or more recesses; and forming a source/drain region in the one ore more recesses, the forming the source/drain region including epitaxially growing a first semiconductor material in the one or more recesses at a temperature of 600° C. to 800° C., the first semiconductor material including doped silicon germanium; and conformally depositing a second semiconductor material over the first semiconductor material at a temperature of 300° C. to 600° C., the second semiconductor material including doped silicon germanium and having a different composition than the first semiconductor material.

20 Claims, 24 Drawing Sheets

(56) References Cited

U.S. PATENT DOCUMENTS

| | | | |
|---|---|---|---|
| 8,847,293 B2 | 9/2014 | Lee et al. | |
| 8,853,025 B2 | 10/2014 | Zhang et al. | |
| 8,860,148 B2 | 10/2014 | Hu et al. | |
| 8,962,400 B2 | 2/2015 | Tsai et al. | |
| 9,093,514 B2 | 7/2015 | Tsai et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,245,805 B2 | 1/2016 | Yeh et al. | |
| 9,520,482 B1 | 12/2016 | Chang et al. | |
| 9,576,814 B2 | 2/2017 | Wu et al. | |
| 2012/0295427 A1 | 11/2012 | Bauer | |
| 2015/0041918 A1 | 2/2015 | Wann et al. | |
| 2015/0263171 A1 | 9/2015 | Hsu et al. | |
| 2016/0013316 A1 | 1/2016 | Kuang et al. | |
| 2016/0027877 A1* | 1/2016 | Lee | H01L 29/66545 |
| | | | 438/285 |
| 2016/0027918 A1* | 1/2016 | Kim | H01L 29/7848 |
| | | | 257/401 |
| 2016/0293749 A1* | 10/2016 | Park | H01L 29/0649 |
| 2016/0315081 A1* | 10/2016 | Park | H01L 29/41791 |
| 2017/0069736 A1* | 3/2017 | Lin | H01L 29/66795 |
| 2017/0076973 A1 | 3/2017 | Lee et al. | |
| 2017/0148797 A1* | 5/2017 | Kim | H01L 29/456 |
| 2017/0154990 A1 | 6/2017 | Sung et al. | |

\* cited by examiner

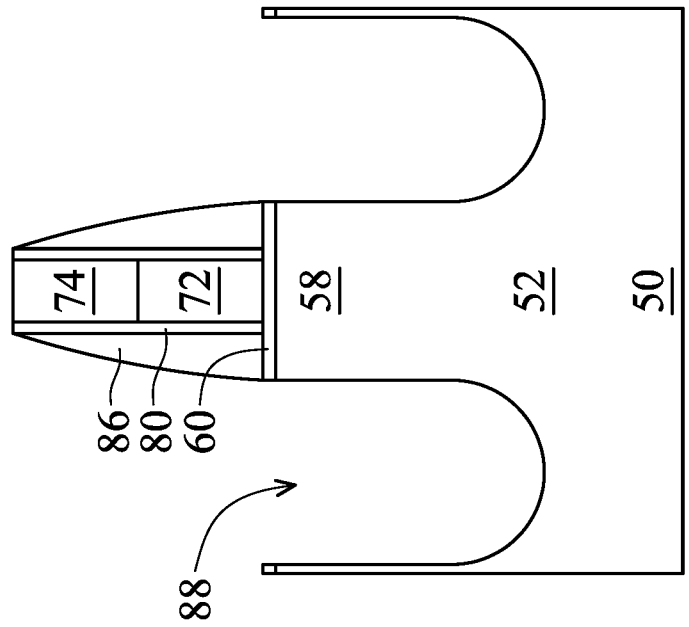
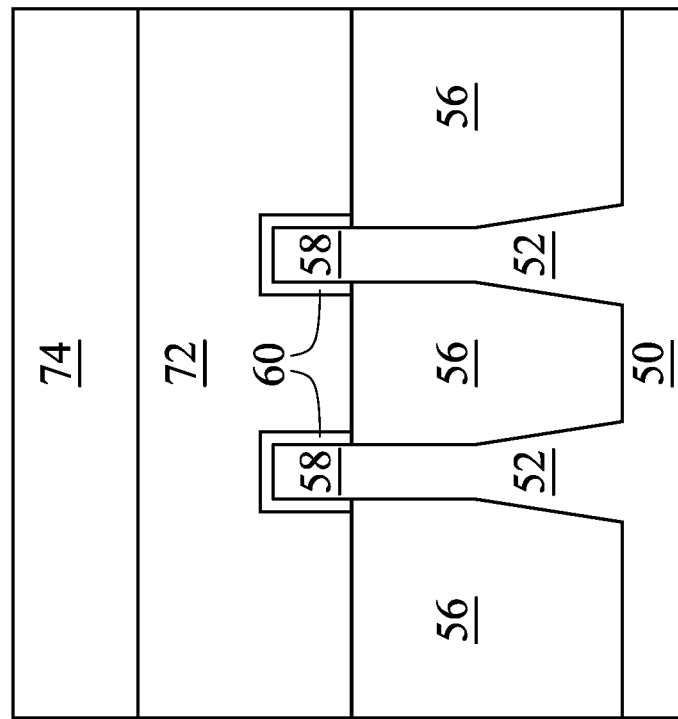
Figure 10B
Figure 10A

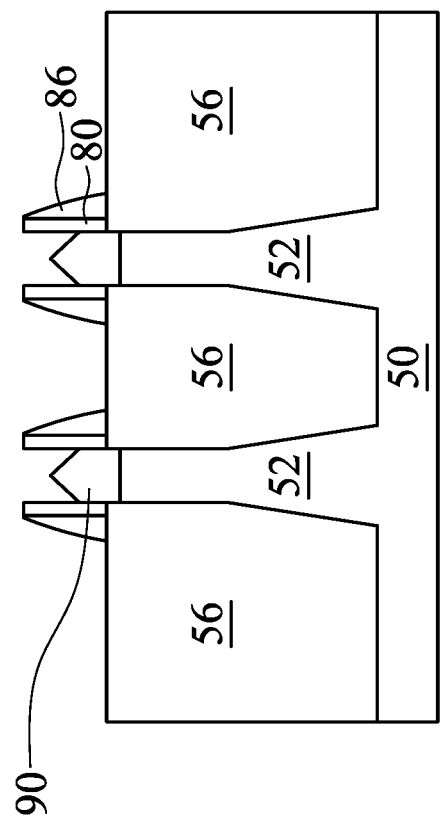
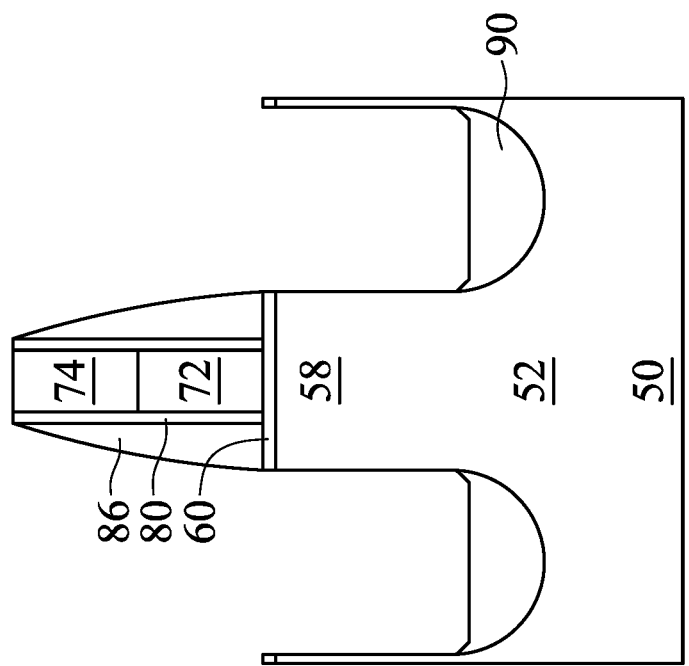
Figure 11B
Figure 11A

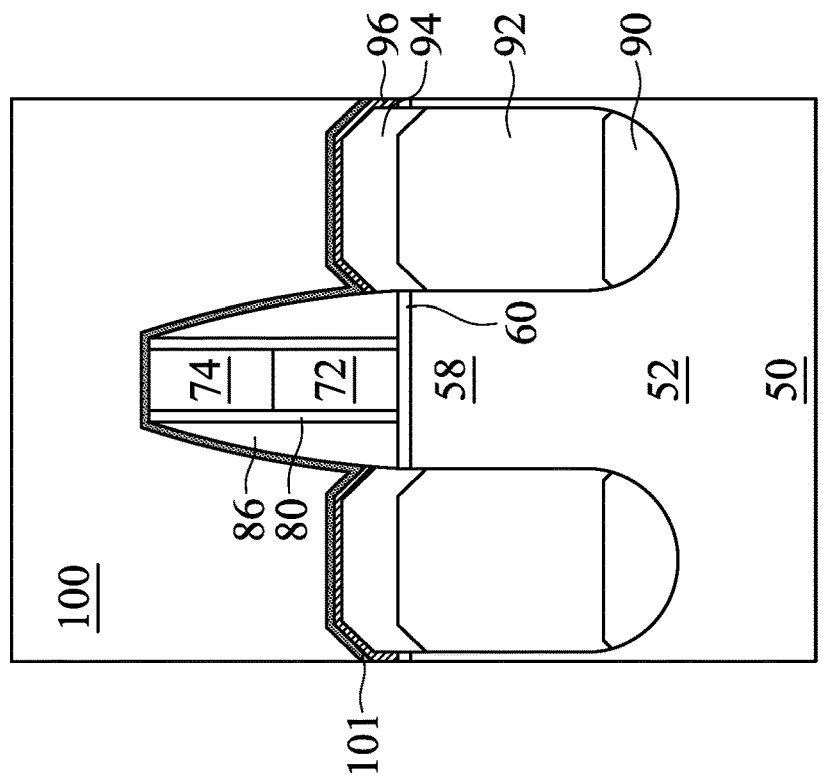
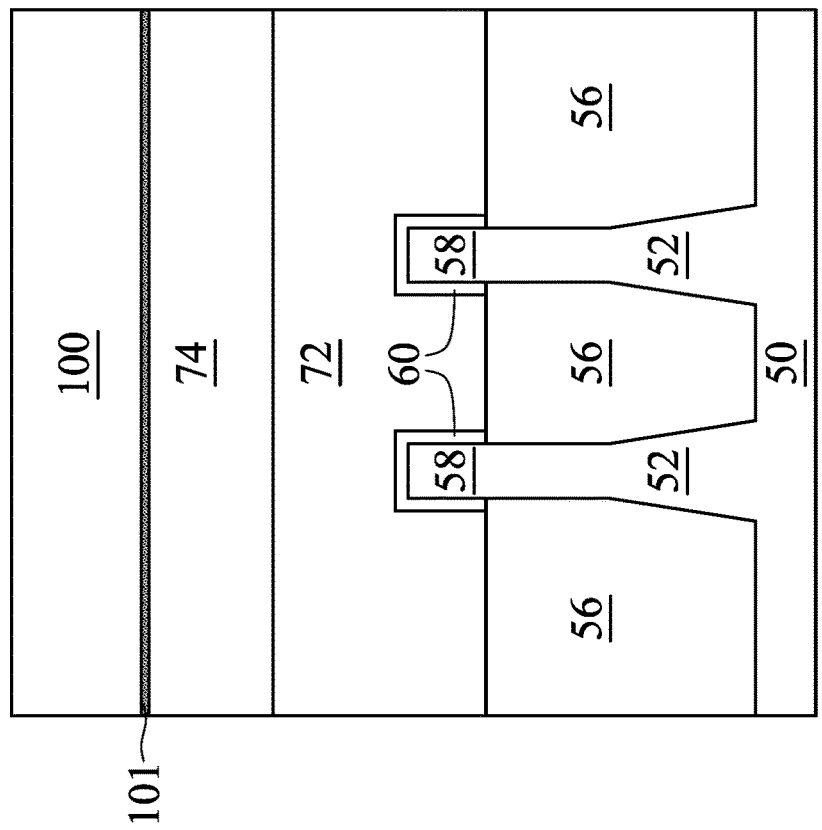
Figure 16B
Figure 16A

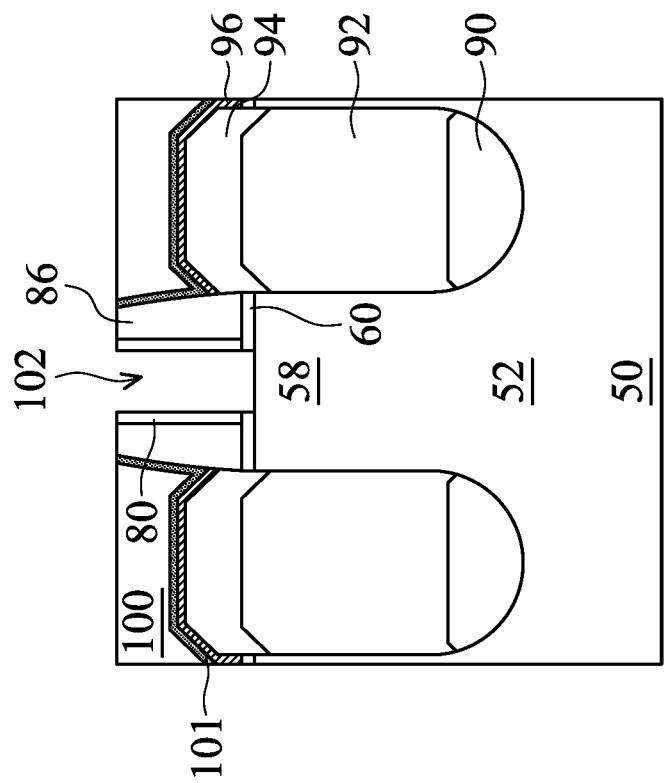
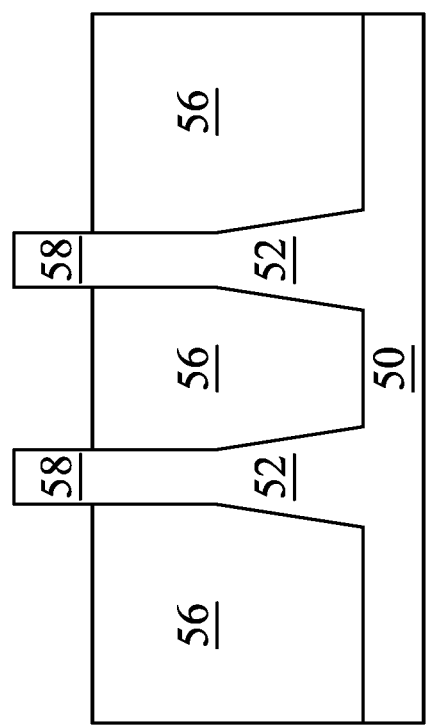
Figure 18B
Figure 18A

SEMICONDUCTOR DEVICE AND METHOD OF MANUFACTURE

PRIORITY CLAIM AND CROSS-REFERENCE

This application is a divisional of U.S. application Ser. No. 16/548,430, filed on Aug. 22, 2019, which claims the benefit of U.S. Provisional Application No. 62/737,698, filed on Sep. 27, 2018, entitled "Semiconductor Device and Method of Manufacture," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10A-10C illustrate cross-sectional views of a formation of recesses, in accordance with some embodiments.

FIGS. 11A and 11B illustrate cross-sectional views of a formation of a first source/drain layer, in accordance with some embodiments.

FIGS. 16A and 16B illustrate cross-sectional views of a formation of a first inter-layer dielectric layer, in accordance with some embodiments.

FIGS. 18A and 18B illustrate cross-sectional views of a formation of recesses, in accordance with some embodiments.

DETAILED DESCRIPTION

Figure 1:
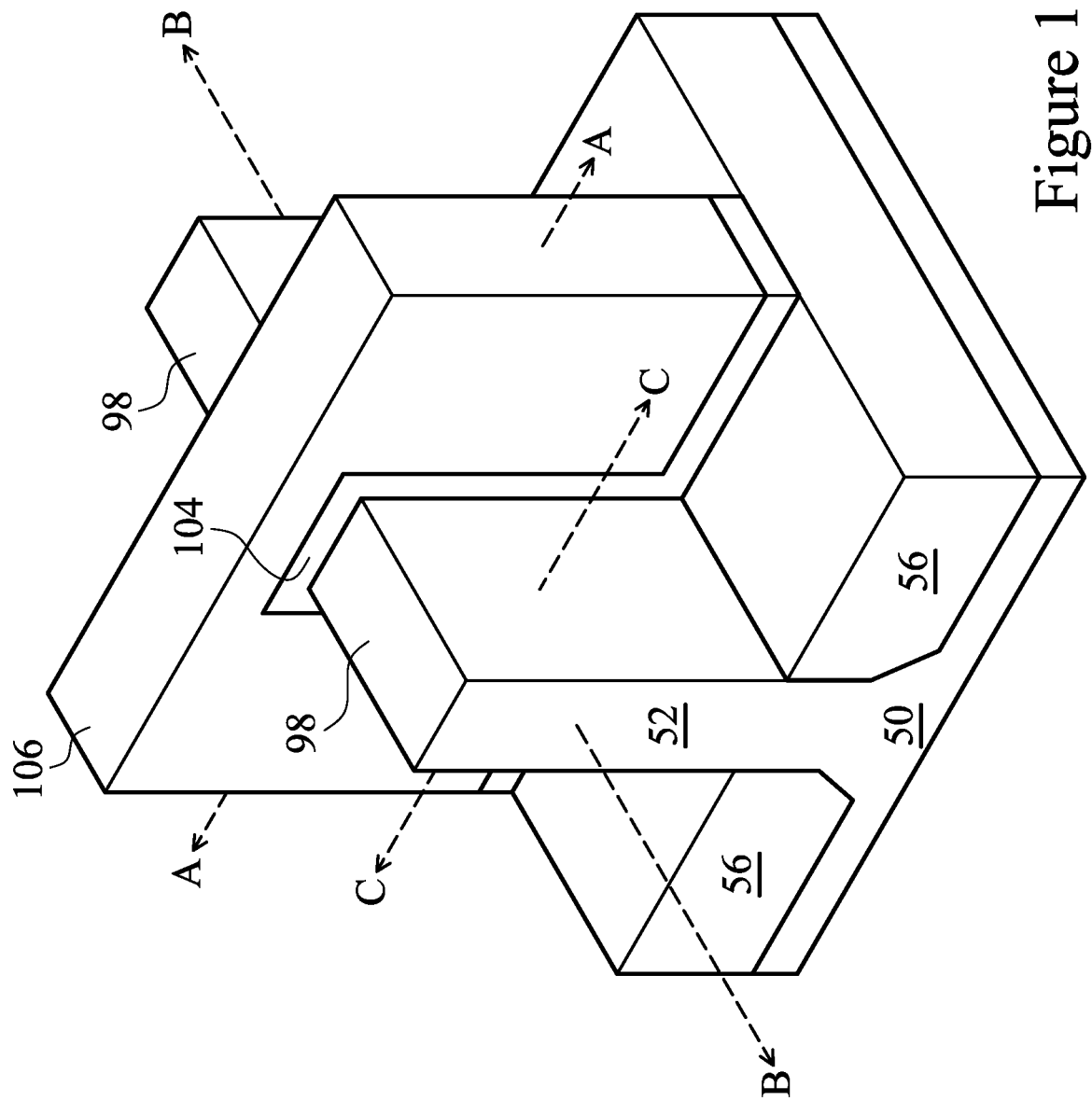
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide processes for forming source/drain regions having increased germanium and dopant concentrations, reduced volume, and an increased waviness (e.g., an increased height difference between a top surface of the source/drain regions and a valley between merged source/drain regions). The source/drain regions may be formed by epitaxially growing a first source/drain layer in a recess formed in a semiconductor fin, epitaxially growing a second source/drain layer over the first source/drain layer, conformally depositing a third source/drain layer over the second source/drain layer, and conformally depositing a fourth source/drain layer over the third source/drain layer. The first source/drain layer and the second source/drain temperature are grown at a temperature of about 600° C. to about 800° C. and the third source/drain layer and the fourth source/drain layer are deposited at a temperature of about 300° C. to about 600° C. Semiconductor devices manufactured according to embodiments of the present application and including the source/drain regions may experience reduced channel resistance $R_{ch}$, reduced source/drain resistance $R_{sd}$, improved device performance such as increased on current ($I_{on}$), reduced gate-to-drain capacitance, reduced RC delay, and boosted device speed.

FIG. 1 illustrates an example of a FinFET in a three-dimensional view, in accordance with some embodiments. The FinFET comprises a fin 52 on a substrate 50 (e.g., a semiconductor substrate). Shallow trench isolation (STI) regions 56 are disposed in the substrate 50, and the fin 52 protrudes above and from between neighboring STI regions 56. Although the STI regions 56 are described/illustrated as being separate from the substrate 50, as used herein the term "substrate" may be used to refer to just the substrate 50 or the substrate 50 inclusive of the STI regions 56. Additionally, although the fin 52 and the substrate 50 are illustrated as a single, continuous material, the fin 52 and/or the substrate 50 may comprise a single material or a plurality of materials. In this context, the fin 52 refers to the portion extending between the neighboring STI regions 56.

A gate dielectric layer 104 is along sidewalls and over a top surface of the fin 52, and a gate electrode 106 is over the gate dielectric layer 104. Source/drain regions 98 are disposed in opposite sides of the fin 52 with respect to the gate dielectric layer 104 and gate electrode 106. FIG. 1 further illustrates reference cross-sections that are used in later figures. Cross-section A-A is along a longitudinal axis of the gate electrode 106 and in a direction, for example, perpendicular to the direction of current flow between the source/drain regions 98 of the FinFET. Cross-section B-B is perpendicular to cross-section A-A and is along a longitudinal axis of the fin 52 and in a direction of, for example, a current flow between the source/drain regions 98 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs. As an example, the FETs discussed herein may be used in a ring-oscillator device.

FIGS. 2 through 21C are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 16A, 17A, 18A, 19A, 20A, and 21A are illustrated along reference cross-section A-A illustrated in FIG. 1, and FIGS. 8B, 9B, 10B, 11A, 12A, 13A, 14A, 15A, 16B, 17B, 18B, 19B, 19C, 20B, and 21B are illustrated along a similar cross-section B-B illustrated in FIG. 1, except for multiple fins/FinFETs. FIGS. 10C, 11B, 12B, 13B, 14B, and 21C are illustrated along reference cross-section C-C illustrated in FIG. 1 in a PMOS region and FIG. 15B is illustrated along reference cross-section C-C illustrated in FIG. 1 in an NMOS region, except for multiple fins/FinFETs.

Figure 2:
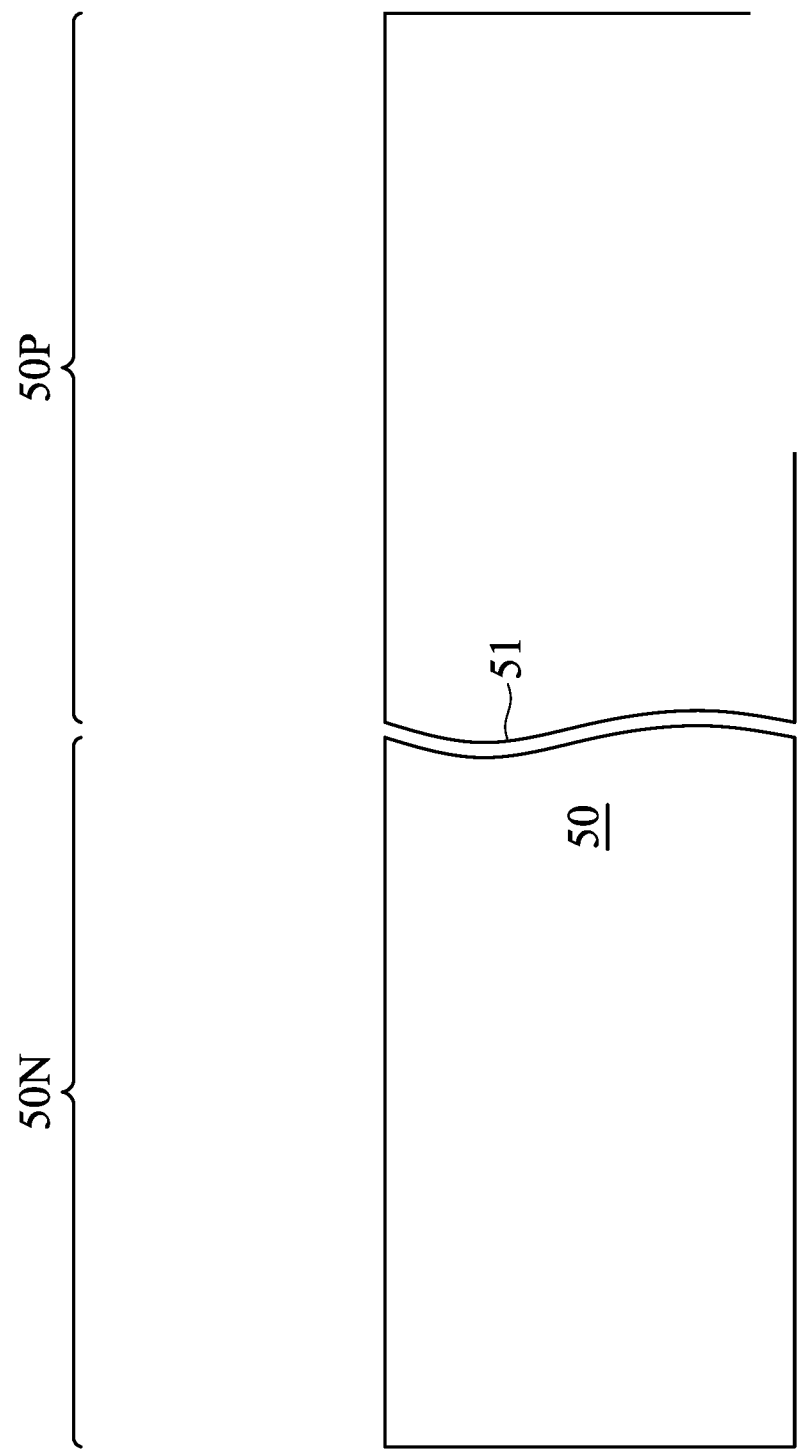
FIG. 2 illustrates a cross-sectional view of a semiconductor substrate, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AnnAs, AlGaAs, GaInAs, GaInP, and/or GaInAsP; or combinations thereof.

The substrate 50 has a region 50N and a region 50P. The region 50N may be for forming n-type devices, such as NMOS transistors, e.g., n-type FinFETs. The region 50P may be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
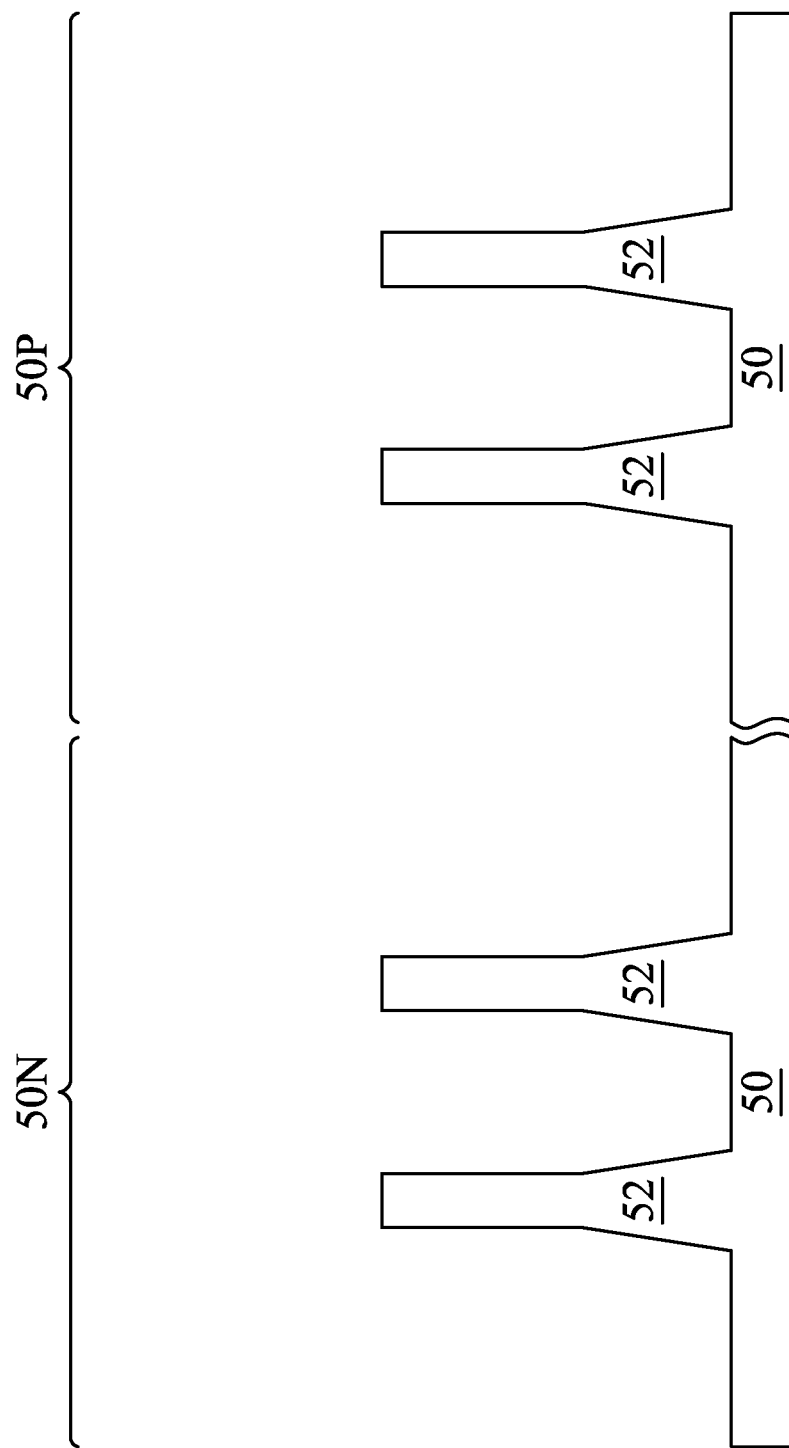
FIG. 3 illustrates a cross-sectional view of a formation of fins, in accordance with some embodiments.

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etching may be anisotropic. Although the fins 52 are illustrated in FIG. 3 as having linear edges, the fins 52 may have rounded edges or any other suitable shape.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 50 and patterned using a photolithography process. Spacers are formed alongside the patterned sacrificial layer using a self-aligned process. The sacrificial layer is then removed, and the remaining spacers may then be used to pattern the fins 52.

Figure 4:
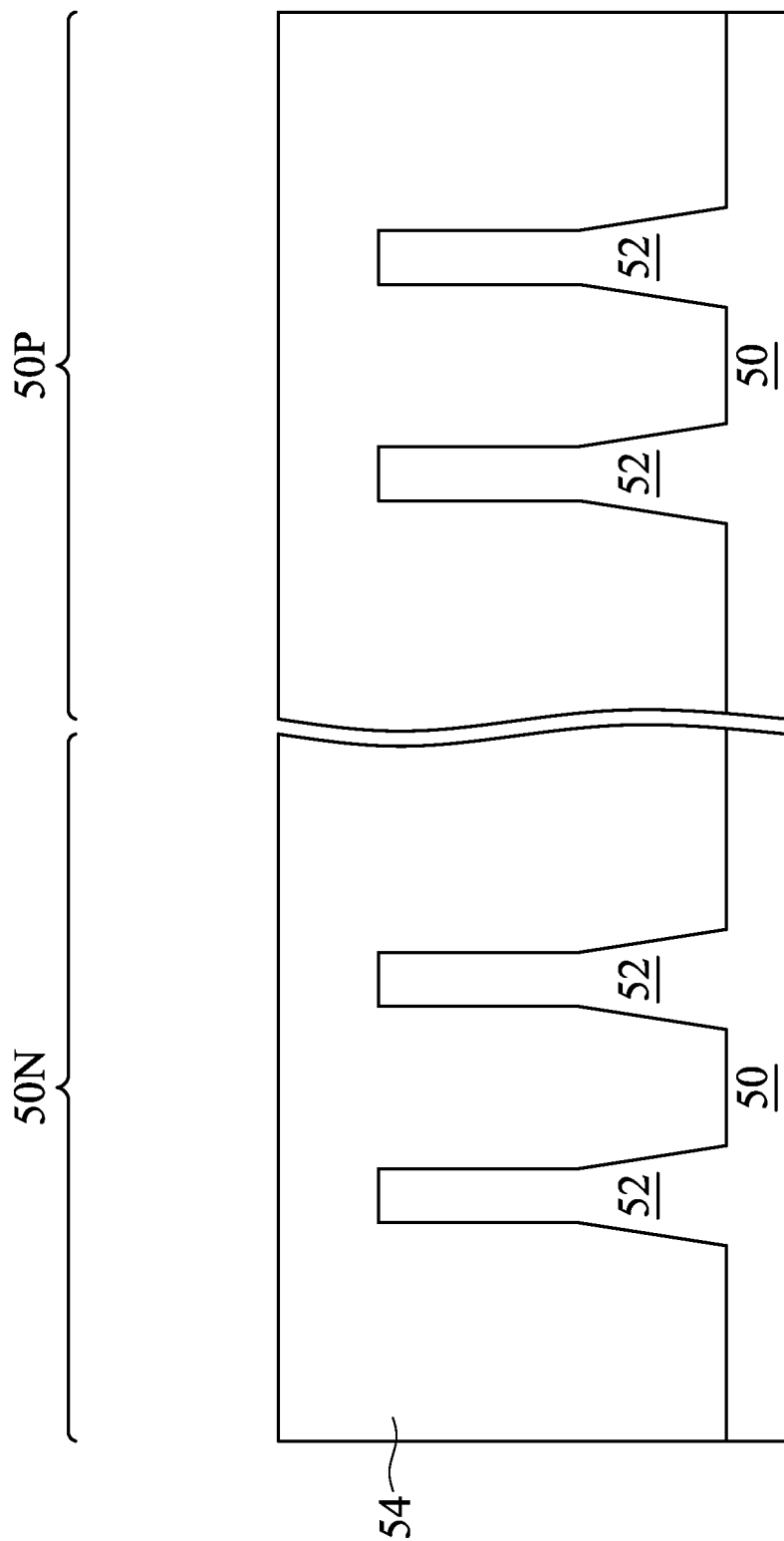
FIG. 4 illustrates a cross-sectional view of a formation of an insulation material, in accordance with some embodiments.

In FIG. 4, an insulation material 54 is formed over the substrate 50 and between neighboring fins 52. The insulation material 54 may be an oxide, such as silicon oxide, a nitride, the like, or a combination thereof, and may be formed by a high-density plasma chemical vapor deposition (HDP-CVD), a flowable CVD (FCVD) (e.g., a CVD-based material deposition in a remote plasma system and post curing to convert the deposited material to another material, such as an oxide), the like, or a combination thereof. Other insulation materials formed by any acceptable process may be used. In the illustrated embodiment, the insulation material 54 is silicon oxide formed by an FCVD process. An anneal process may be performed once the insulation material 54 is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not separately illustrated) may first be formed along a surface of the substrate 50 and the fins 52. Thereafter, a fill material, such as those discussed above may be formed over the liner.

Figure 5:
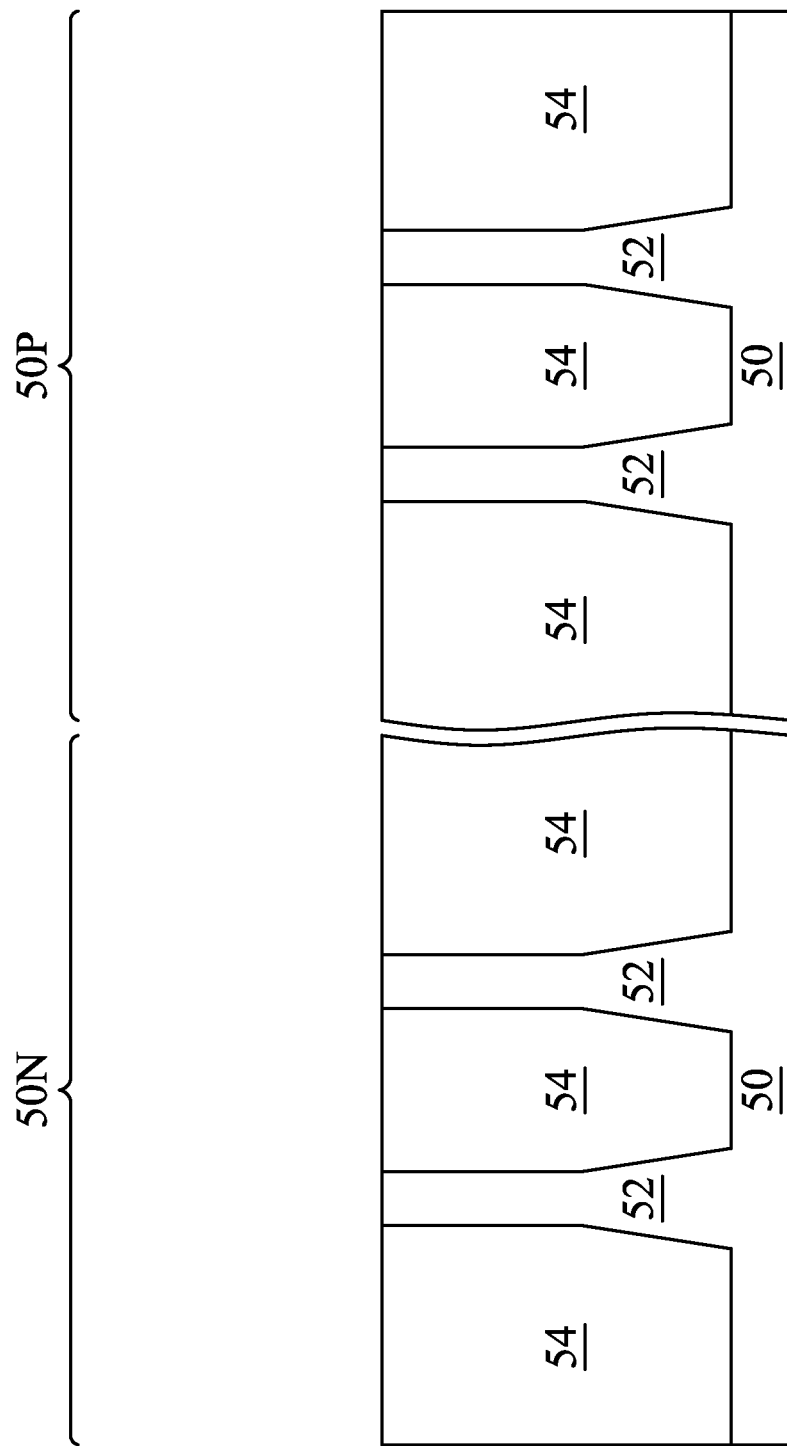
FIG. 5 illustrates a cross-sectional view of a planarization of the insulation material, in accordance with some embodiments.

In FIG. 5, a removal process is applied to the insulation material 54 to remove excess insulation material 54 over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material 54 are level after the planarization process is complete.

Figure 6:
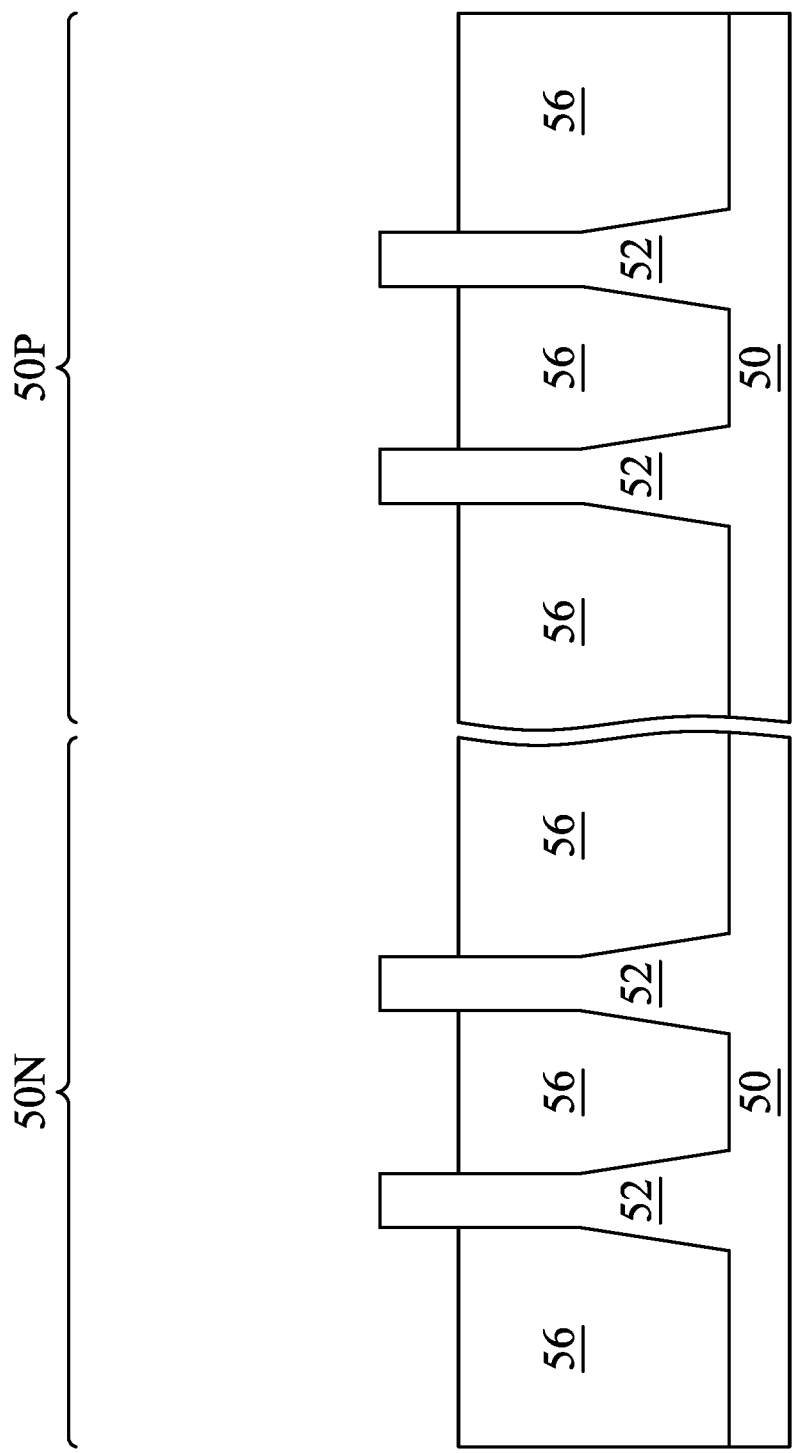
FIG. 6 illustrates a cross-sectional view of a formation of isolation regions, in accordance with some embodiments.

In FIG. 6, the insulation material 54 is recessed to form shallow trench isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by using an appropriate etch. The STI regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used.

The process described with respect to FIGS. 2 through 6 is just one example of how the fins 52 may be formed. In some embodiments, the fins 52 may be formed by an epitaxial growth process. For example, a dielectric layer may be formed over a top surface of the substrate 50, and trenches can be etched through the dielectric layer to expose the underlying substrate 50. Homoepitaxial structures may be epitaxially grown in the trenches, and the dielectric layer may be recessed such that the homoepitaxial structures protrude from the dielectric layer to form fins 52. Additionally, in some embodiments, heteroepitaxial structures may be used for the fins 52. For example, the fins 52 in FIG. 5 may be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer may be formed over a top surface of the substrate 50, and trenches may be etched through the dielectric layer. Heteroepitaxial structures may then be epitaxially grown in the trenches using a material different from the substrate 50, and the dielectric layer may be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations, although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x may be in the range of 0 to 1), silicon carbide, pure or substantially pure germanium, a III-V compound semiconductor, a II-VI compound semiconductor, or the like. For example, the available materials for forming a III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not separately illustrated) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist may be formed by using a spin-on technique and may be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ atoms/cm$^3$, such as from about $10^{17}$ atoms/cm$^3$ to about $10^{18}$ atoms/cm$^3$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist may be formed by using a spin-on technique and may be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, $BF_2$, indium, or the like implanted in the region to a concentration of equal to or less than $10^{18}$ atoms/cm$^3$, such as from about $10^{17}$ atoms/cm$^3$ to about $10^{18}$ atoms/cm$^3$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 7:
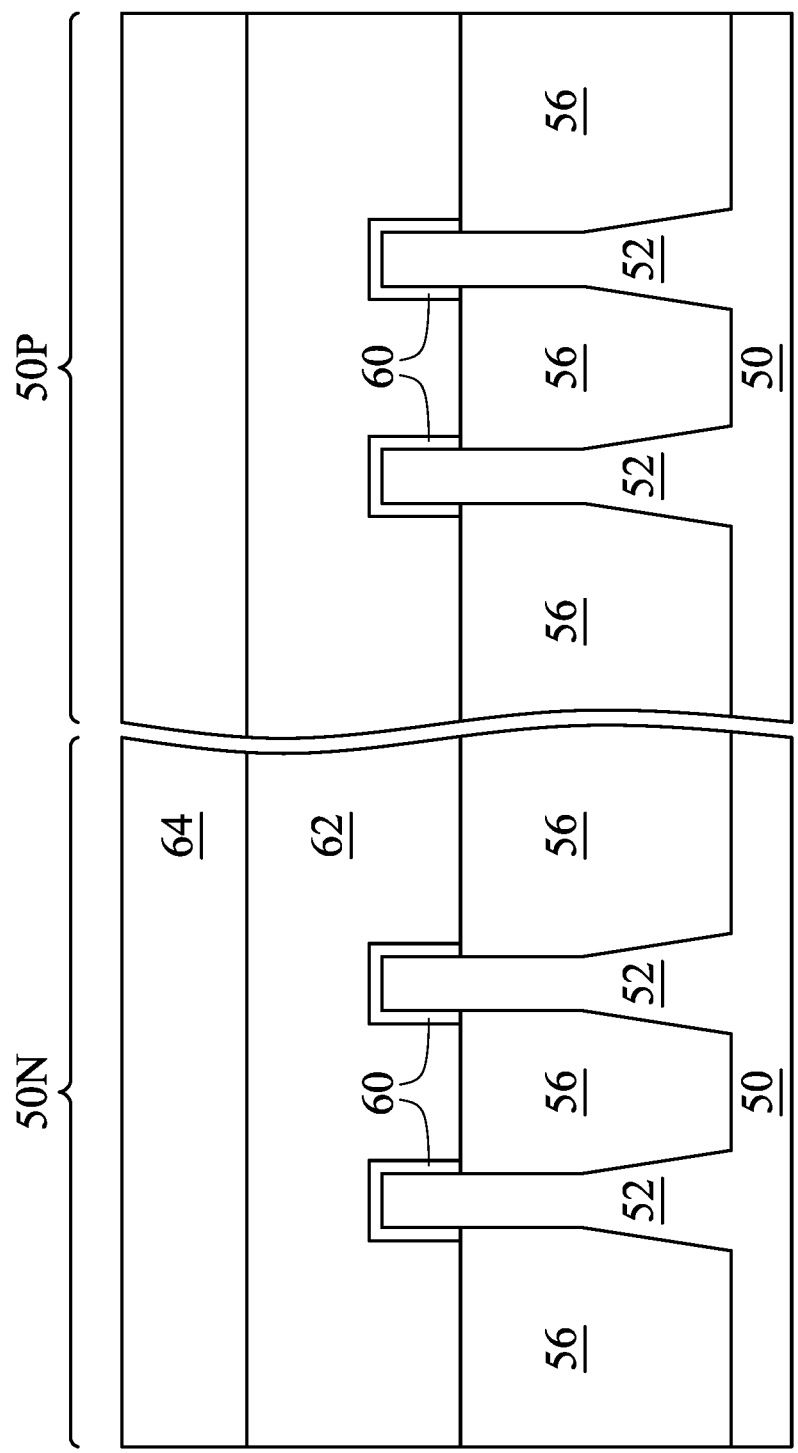
FIG. 7 illustrates a cross-sectional view of a formation of a dummy dielectric layer, a dummy gate layer, and a mask layer, in accordance with some embodiments.

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized by a process such as CMP. The mask layer 64 may be deposited over the dummy gate layer 62. The dummy gate layer 62 may be a conductive material and may be selected from a group including amorphous silicon, polycrystalline-silicon (polysilicon), poly-crystalline silicon-germanium (poly-SiGe), metallic nitrides, metallic silicides, metallic oxides, metals, and the like. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions (e.g., the STI regions 56). The mask layer 64 may include, for example, SiN, SiON, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 21C illustrate various additional steps in the manufacturing of embodiment devices. FIGS. 8A through 21C illustrate features in either of the region 50N and the region 50P. For example, the structures illustrated in FIGS. 8A through 16B may be applicable to both the region 50N and the region 50P. Differences (if any) in the structures of the region 50N and the region 50P are described in the text accompanying each figure.

Figure 8B:
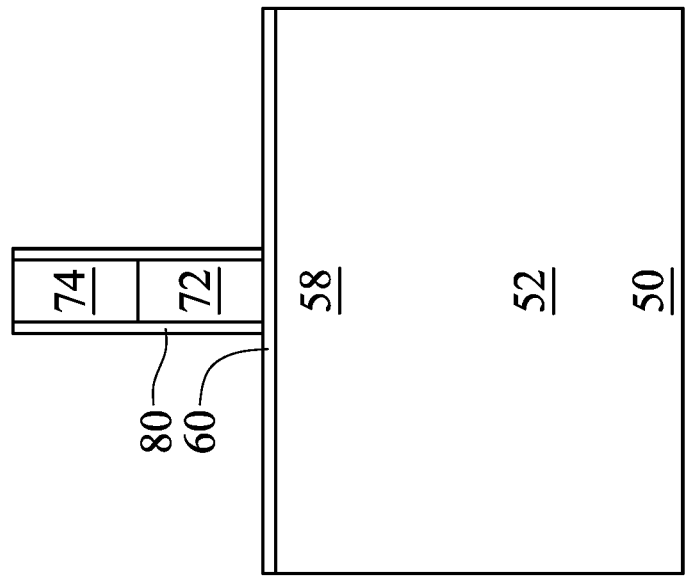
FIGS. 8A and 8B illustrate cross-sectional views of a formation of a dummy gate, a mask, and gate seal spacers, in accordance with some embodiments.
Figure 8A:
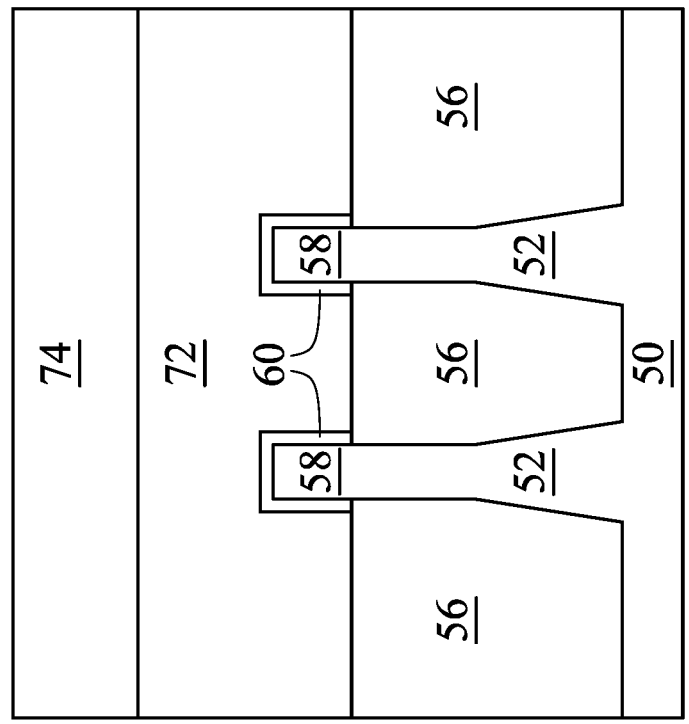

In FIGS. 8A and 8B, the mask layer 64 (see FIG. 7) may be patterned using acceptable photolithography and etching techniques to form masks 74. The pattern of the masks 74 then may be transferred to the dummy gate layer 62 by an acceptable etching technique to form dummy gates 72. In some embodiments (not separately illustrated), the pattern of the masks 74 may also be transferred to the dummy dielectric layer 60 by an acceptable etching technique. The dummy gates 72 cover respective channel regions 58 of the fins 52. The pattern of the masks 74 may be used to physically separate each of the dummy gates 72 from adjacent dummy gates 72. The dummy gates 72 may have a lengthwise direction substantially perpendicular to the lengthwise direction of respective fins 52.

Further in FIGS. 8A and 8B, gate seal spacers 80 may be formed on exposed surfaces of the dummy gates 72, the masks 74, and/or the fins 52. A thermal oxidation or a deposition followed by an anisotropic etch may be used to form the gate seal spacers 80.

After the formation of the gate seal spacers 80, implants for lightly doped source/drain (LDD) regions (not separately illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of about $10^{15}$ atoms/cm³ to about $10^{16}$ atoms/cm³. An anneal may be used to activate the implanted impurities.

Figure 9B:
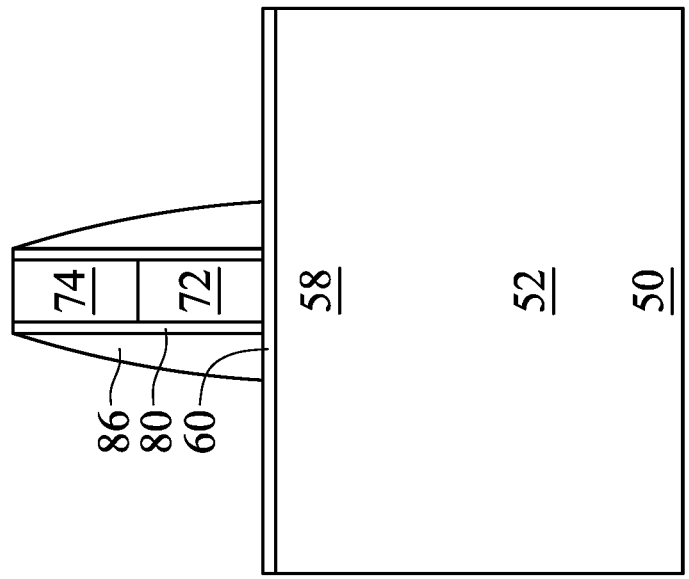
FIGS. 9A and 9B illustrate cross-sectional views of a formation of gate spacers, in accordance with some embodiments.
Figure 9A:
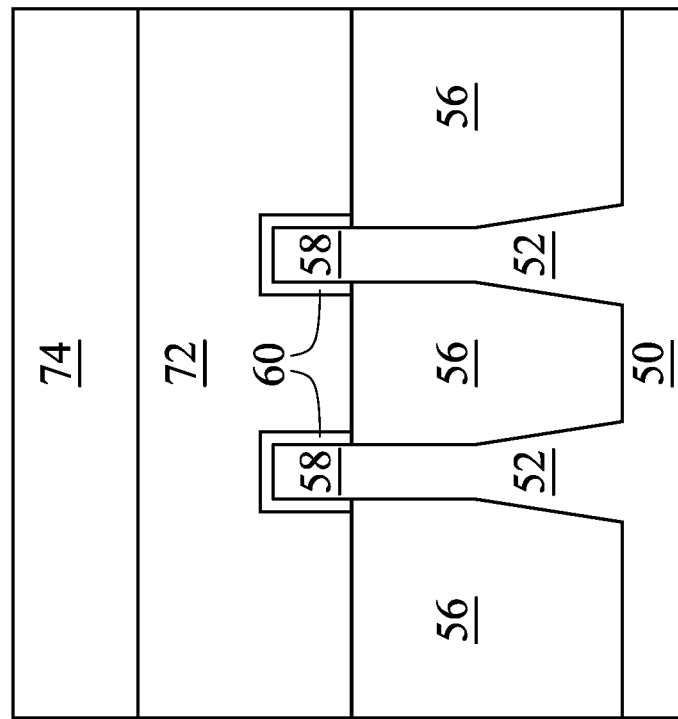

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon nitride, SiCN, a combination thereof, or the like.

Figure 10C:
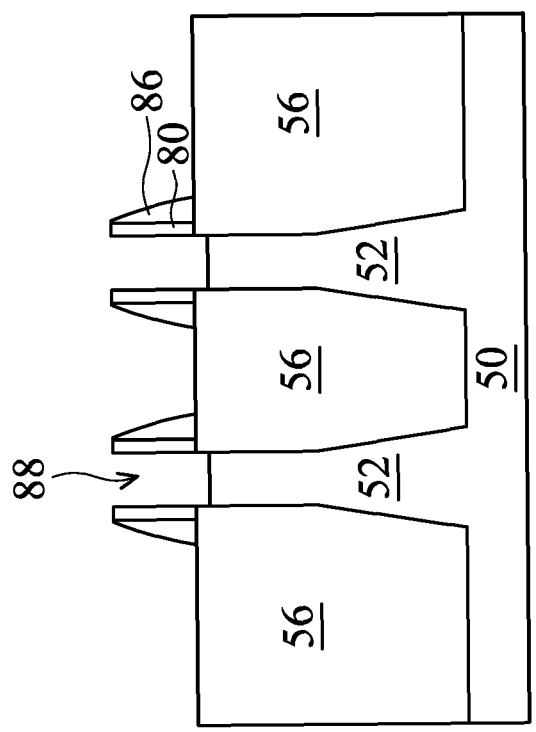

FIGS. 10A-14B illustrate various steps in forming source/drain regions 98A in the fins 52 in the region 50P. As illustrated in FIGS. 10A-14B, the source/drain regions 98A in the region 50P may be formed using a multi-step epitaxial deposition process. The source/drain regions 98A in the region 50P, e.g., the PMOS region, may be formed by masking the region 50N, e.g., the NMOS region, and etching source/drain regions of the fins 52 in the region 50P are etched to form recesses 88 in the fins 52, as illustrated in FIGS. 10A-10C.

In FIGS. 11A and 11B, a first source/drain layer 90 is epitaxially grown in the recesses 88. The first source/drain layer 90 may include any acceptable material, such as appropriate for p-type FinFETs. For example, in embodiments in which the fin 52 comprises silicon, the first source/drain layer 90 in the region 50P may comprise materials exerting a compressive strain in the channel region 58, such as SiGe, SiGeB, Ge, GeSn, or the like. In some embodiments, the first source/drain layer 90 may comprise silicon germanium having an atomic percentage of germanium of about 20 percent to about 40 percent.

The first source/drain layer 90 may be implanted with dopants using in situ doping during growth, or using a process similar to the process previously discussed for forming lightly-doped source/drain regions, followed by an anneal. The first source/drain layer 90 may have an impurity concentration of less than about $5 \times 10^{20}$ atoms/cm³. The dopants may include p-type impurities such as boron, $BF_2$, indium, or the like.

The first source/drain layer 90 is grown at a temperature of about 600° C. to about 800° C., such as about 700° C. and a pressure of about 5 Torr to about 50 Torr, such as about 25 Torr. The first source/drain layer 90 is grown for a period of about 10 seconds to about 200 seconds, such as about 100 seconds. The first source/drain layer 90 may be epitaxially grown from a precursor gas such as silane, disilane, dichlorosilane, germane, germanium tetrachloride, combinations thereof, or the like. The first source/drain layer 90 has a thickness of about 1 nm to about 10 nm, such as about 5 nm. As illustrated in FIGS. 11A and 11B, the first source/drain layer 90 may have facets.

Figure 12B:
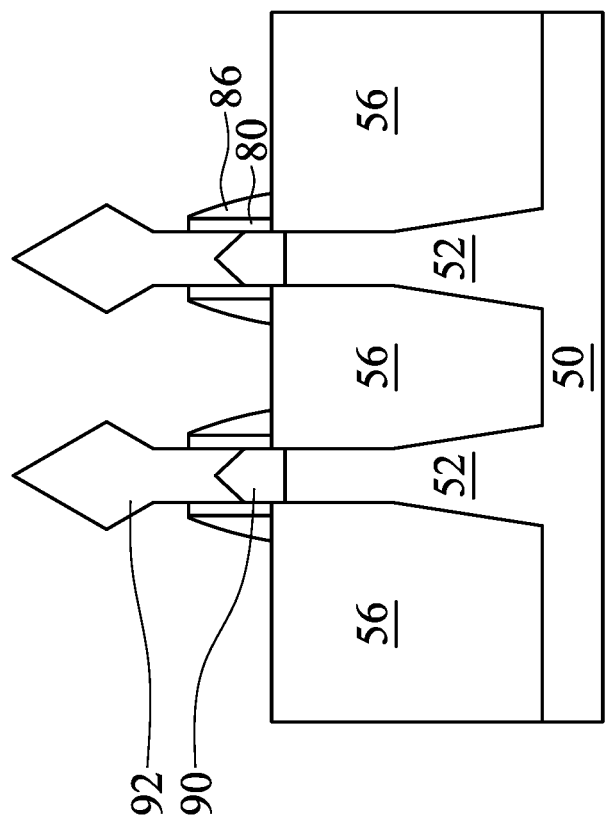
FIGS. 12A and 12B illustrate cross-sectional views of a formation of a second source/drain layer, in accordance with some embodiments.
Figure 12A:
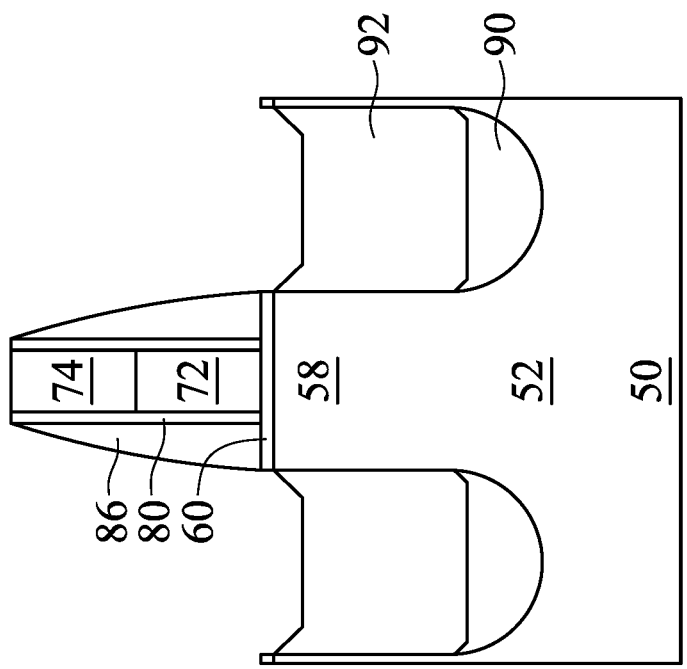

In FIGS. 12A and 12B, a second source/drain layer 92 is epitaxially grown in the recesses 88 over the first source/drain layer 90. The second source/drain layer 92 may include any acceptable material, such as appropriate for p-type FinFETs. For example, the second source/drain layer 92 may comprise materials exerting a compressive strain in the channel region 58, such as SiGe, SiGeB, Ge, GeSn, or the like. In some embodiments, the second source/drain layer 92 may comprise silicon germanium having an atomic percentage of germanium of about 40 percent to about 50 percent.

The second source/drain layer 92 may be implanted with dopants using in situ doping during growth, or using a process similar to the process previously discussed for forming lightly-doped source/drain regions, followed by an anneal. The second source/drain layer 92 may have an impurity concentration of greater than about $6 \times 10^{20}$ atoms/cm³. The dopants may include p-type impurities such as boron, $BF_2$, indium, or the like.

The first source/drain layer 90 is grown at a temperature of about 600° C. to about 800° C., such as about 700° C. and a pressure of about 5 Torr to about 50 Torr, such as about 25

Torr. The first source/drain layer 90 is grown for a period of about 10 seconds to about 200 seconds, such as about 100 seconds. The first source/drain layer 90 may be epitaxially grown from a precursor gas such as silane, disilane, dichlorosilane, germane, germanium tetrachloride, combinations thereof, or the like. The first source/drain layer 90 has a thickness of about 1 nm to about 10 nm, such as about 5 nm. As illustrated in FIGS. 11A and 11B, the first source/drain layer 90 may have facets.

The second source/drain layer 92 is grown at a temperature of about 600° C. to about 800° C., such as about 700° C. and a pressure of about 5 Torr to about 50 Torr, such as about 25 Torr. The second source/drain layer 92 is grown for a period of about 100 seconds to about 600 seconds, such as about 500 seconds. The second source/drain layer 92 may be epitaxially grown from a precursor gas such as silane, disilane, dichlorosilane, germane, germanium tetrachloride, combinations thereof, or the like. The second source/drain layer 92 has a thickness of less than about 25 nm or less than about 40 nm, such as about 20 nm. As illustrated in FIGS. 12A and 12B, the second source/drain layer 92 may have facets. Although the second source/drain layer 92 is illustrated in FIGS. 12A and 12B as being unmerged, in some embodiments, the facets may cause adjacent second source/drain layers 92 to merge.

Figure 13B:
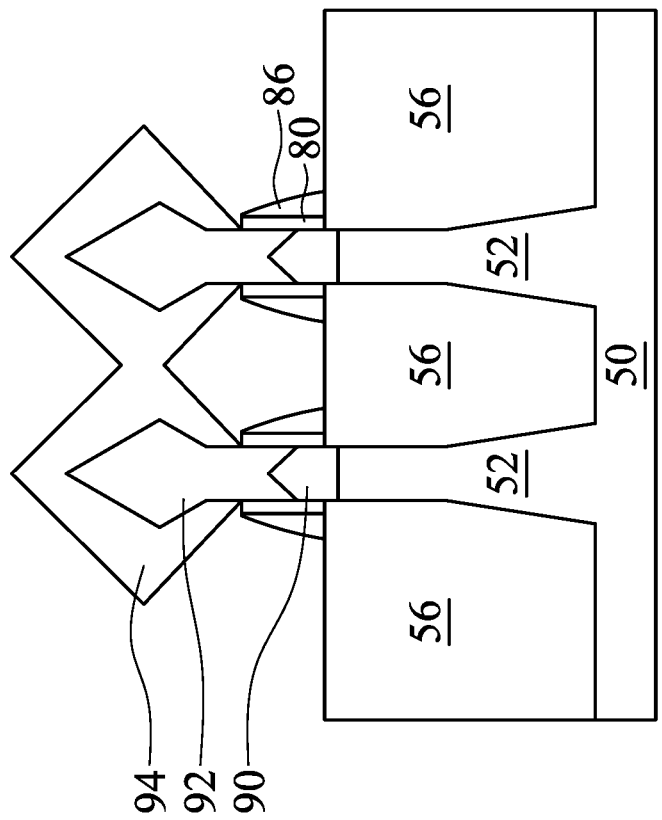
FIGS. 13A and 13B illustrate cross-sectional views of a formation of a third source/drain layer, in accordance with some embodiments.
Figure 13A:
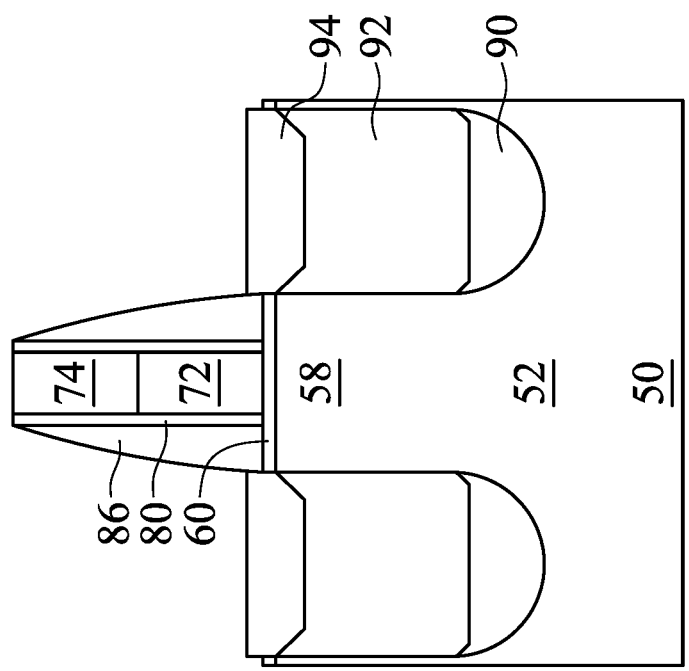

In FIGS. 13A and 13B, a third source/drain layer 94 is conformally deposited in the recesses 88 over the second source/drain layer 92. The third source/drain layer 94 may be deposited using a conformal process such as chemical vapor deposition (CVD), atomic layer deposition (ALD), or the like. The third source/drain layer 94 may include any acceptable material, such as appropriate for p-type FinFETs. For example, the third source/drain layer 94 may comprise materials exerting a compressive strain in the channel region 58, such as SiGe, SiGeB, Ge, GeSn, or the like. In some embodiments, the third source/drain layer 94 may comprise silicon germanium having an atomic percentage of germanium of about 60 percent to about 80 percent.

In some embodiments, the third source/drain layer 94 may be formed by a selective deposition process. For example, the third source/drain layer 94 may be deposited by a selective CVD process or the like. In representative embodiments an etching gas (e.g., $SiH_2Cl_2$, HCl, or the like) may be used to control selective growth between silicon germanium areas of the second source/drain layer 92 and dielectric surfaces of the dummy dielectric layer 60, the gate spacers 86, the gate seal spacers 80, and the masks 74. In other embodiments, deposition and etching processes may be separately performed or otherwise separately controlled. For example, an epitaxial deposition process may be performed for non-selective growth of the third source/drain layer 94, followed by etching steps to remove deposited material from dielectric surfaces of the dummy dielectric layer 60, the gate spacers 86, the gate seal spacers 80, and the masks 74 to maintain selectivity.

The third source/drain layer 94 may be implanted with dopants using in situ doping during deposition, or using a process similar to the process previously discussed for forming lightly-doped source/drain regions, followed by an anneal. The third source/drain layer 94 may have an impurity concentration of greater than about $8 \times 10^{20}$ atoms/cm³. The dopants may include p-type impurities such as boron, $BF_2$, indium, or the like.

The third source/drain layer 94 is deposited at a temperature of about 300° C. to about 600° C., such as about 450° C. and a pressure of greater than about 20 Torr, such as about 50 Torr. The low-temperature high-pressure process used to form the third source/drain layer 94 causes the third source/drain layer 94 to be formed conformally over the second source/drain layer 92. As illustrated in FIG. 13B, this avoids growth of the third source/drain layer 94 in the (100) plane between adjacent fins 52, such that a valley is formed in a merged portion of the third source/drain layer 94 between adjacent fins 52. The third source/drain layer 94 is deposited for a period of about 100 seconds to about 300 seconds, such as about 200 seconds. The third source/drain layer 94 may be epitaxially grown from a precursor gas such as silane, disilane, dichlorosilane, germane, germanium tetrachloride, combinations thereof, or the like. The third source/drain layer 94 has a thickness of greater than about 20 nm, such as about 30 nm. As illustrated in FIGS. 13A and 13B, the third source/drain layer 94 may have surfaces raised from respective surfaces of the fins 52 and may have facets. Further, the conformal processes used to form the third source/drain layer 94 may cause adjacent third source/drain layers 94 to merge, as illustrated in FIG. 13B.

Figures 14A, 14B:
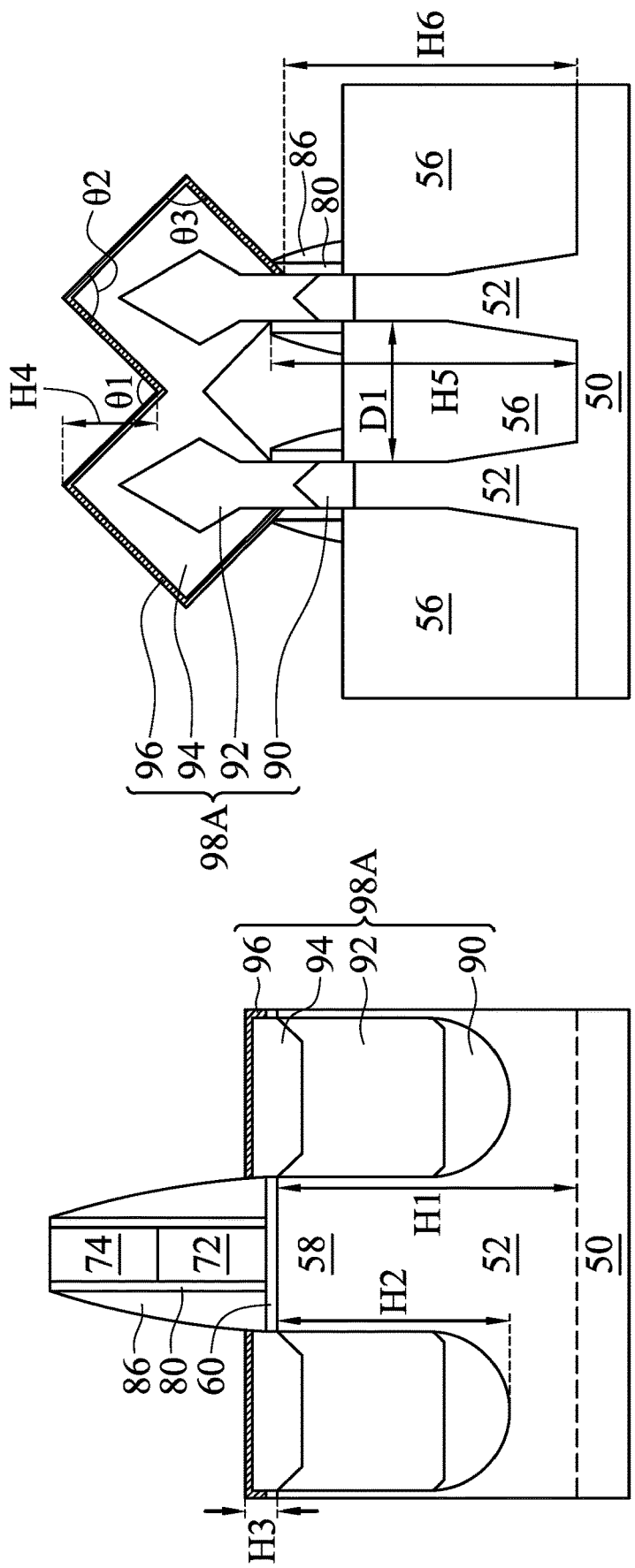
FIGS. 14A and 14B illustrate cross-sectional views of a formation of a fourth source/drain layer, in accordance with some embodiments.
Figures 15A, 15B:
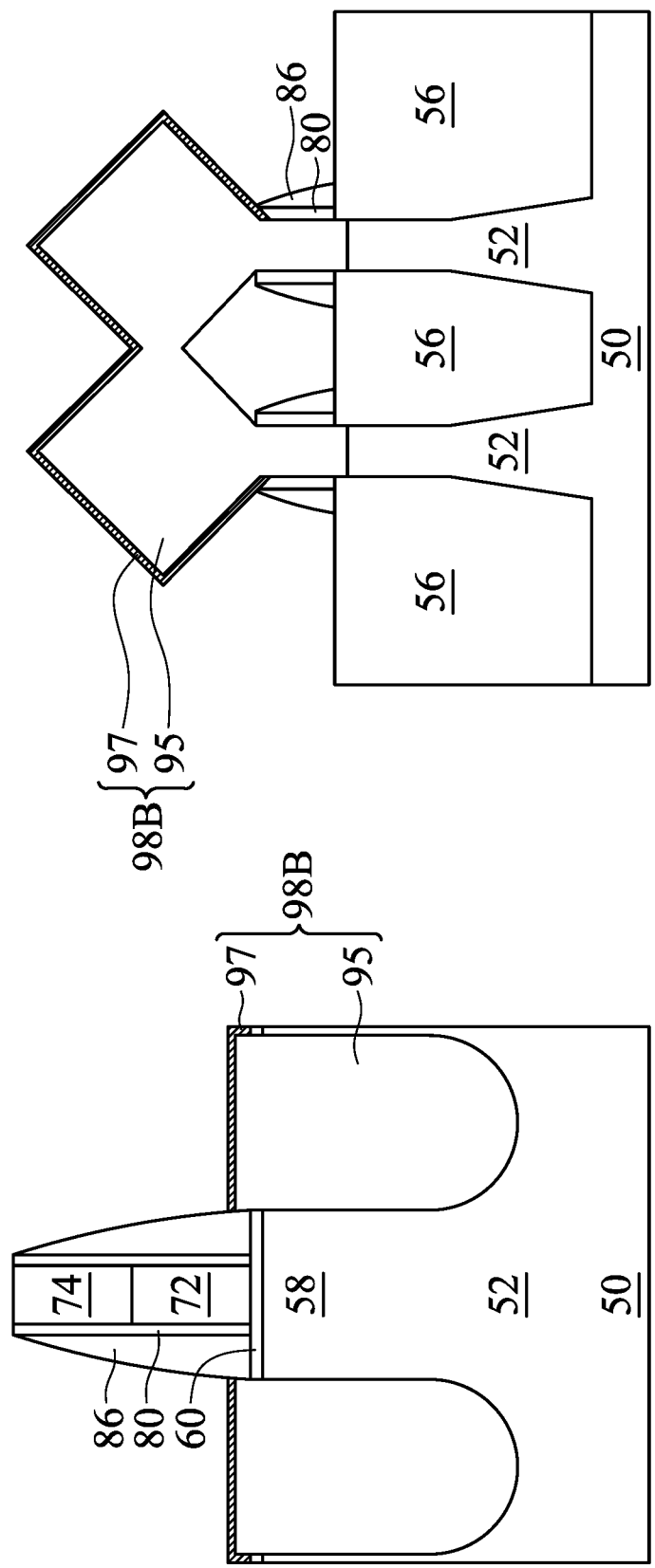
FIGS. 15A and 15B illustrate cross-sectional views of a formation of a first source/drain layer and a second source/drain layer, in accordance with some embodiments.

In FIGS. 14A and 14B, a fourth source/drain layer 96 is conformally deposited over the third source/drain layer 94 to form source/drain regions 98A comprising the first source/drain layer 90, the second source/drain layer 92, the third source/drain layer 94, and the fourth source/drain layer 96. The fourth source/drain layer 96 may be deposited using a conformal process such as chemical vapor deposition (CVD), atomic layer deposition (ALD), or the like. The fourth source/drain layer 96 may include any acceptable material, such as appropriate for p-type FinFETs. For example, the fourth source/drain layer 96 may comprise materials exerting a compressive strain in the channel region 58, such as SiGe, SiGeB, Ge, GeSn, or the like. In some embodiments, the fourth source/drain layer 96 may comprise silicon germanium having an atomic percentage of germanium of less than about 40 percent.

In some embodiments, the fourth source/drain layer 96 may be formed by a selective deposition process. For example, the fourth source/drain layer 96 may be deposited by a selective CVD process, a selective ALD process, or the like. In representative embodiments an etching gas (e.g., $SiH_2Cl_2$, HCl, or the like) may be used to control selective growth between silicon germanium areas of the third source/drain layer 94 and dielectric surfaces of the dummy dielectric layer 60, the gate spacers 86, the gate seal spacers 80, and the masks 74. In other embodiments, deposition and etching processes may be separately performed or otherwise separately controlled. For example, an epitaxial deposition process may be performed for non-selective growth of the fourth source/drain layer 96, followed by etching steps to remove deposited material from dielectric surfaces of the dummy dielectric layer 60, the gate spacers 86, the gate seal spacers 80, and the masks 74 to maintain selectivity.

The fourth source/drain layer 96 may be implanted with dopants using in situ doping during deposition, or using a process similar to the process previously discussed for forming lightly-doped source/drain regions, followed by an anneal. The fourth source/drain layer 96 may have an impurity concentration of greater than about $1 \times 10^{20}$ atoms/cm³. The dopants may include p-type impurities such as boron, $BF_2$, indium, or the like.

The fourth source/drain layer 96 is deposited at a temperature of about 300° C. to about 600° C., such as about 450° C. The fourth source/drain layer 96 is deposited for a period from about 10 seconds to about 200 seconds, such as about 100 seconds. The fourth source/drain layer 96 has a thickness of less than about 10 nm, such as about 5 nm. The fourth source/drain layer 96 may be epitaxially grown from a precursor gas such as silane, disilane, dichlorosilane, germane, germanium tetrachloride, combinations thereof, or the like. As illustrated in FIGS. 14A and 14B, the fourth source/drain layer 96 may have surfaces raised from respective surfaces of the fins 52 and may have facets.

The fourth source/drain layer 96 may be a sacrificial layer or an etch stop layer. For example, as will be discussed in greater detail below with respect to FIG. 19B, the fourth source/drain layer 96 may protect the third source/drain layer 94 during an etch process used to form openings in which source/drain contacts 116 are formed.

As illustrated in FIG. 14A, a height H1 between a top surface of the fins 52 and a bottom of the fins 52 is greater than about 40 nm. A height H2 between the top surface of the fins 52 and a bottom surface of the source/drain regions 98A is greater than about 40 nm. A height H3 between a top surface of the source/drain regions 98A and the top surface of the fins 52 is greater than about 3 nm. As illustrated in FIG. 14B, adjacent source/drain regions 98A may be merged. A height H4 between the top surface of the source/drain regions 98A and a valley between the source/drain regions 98A is greater than about 5 nm. A height H5 between a bottom surface of an inner facet of the source/drain regions 98A and the bottom of the fins 52 is greater than 25 nm. A height H6 between a bottom surface of an outer facet of the source/drain regions 98A and the bottom of the fins 52 is greater than 20 nm. The height H5 and the height H6 of the source/drain regions 98A may be greater in order to confine lateral growth of the first source/drain layer 90 and the second source/drain layer 92 and to control the critical dimensions of the source/drain regions 98A. A distance D1 between inner surfaces of adjacent fins 52 is greater than 5 nm. An angle θ1 between intersecting facets at the valley between the source/drain regions 98A is less than about 90 degrees. An angle θ2 between intersecting facets at the top surface of the source/drain regions 98A is less than about 90 degrees. An angle θ3 between intersecting facets at an outermost side surface is greater than about 90 degrees.

The source/drain regions 98A formed according to the embodiments described above may have a wavier profile in the reference cross-section C-C (e.g., the height H4 may be increased and angle θ1 and angle θ2 may be decreased), which increases the contact area between the source/drain regions 98A and subsequently formed source/drain contacts 116 (discussed below in reference to FIG. 19B) and reduces source/drain resistance $R_{sd}$. The source/drain regions 98A may also have reduced volume, which reduces gate-to-drain capacitance $C_{gd}$. Further, the source/drain regions 98A may have greater concentrations of germanium and dopant ions (e.g., boron), which increases the stress exerted on respective channel regions 58, reduces channel resistance $R_{ch}$, reduces the source/drain resistance $R_{sd}$, improves device performance $I_{on}$, reduces RC delay, and boosts device speed.

In FIGS. 15A and 15B, source/drain regions 98B are formed in the fins 52 in the region 50N. The source/drain regions 98B may be formed by conventional methods. The source/drain regions 98B in the region 50N, e.g., the NMOS region, may be formed by masking the region 50P, e.g., the PMOS region, and etching source/drain regions of the fins 52 in the region 50P are etched to form recesses (not separately illustrated) in the fins 52. Then, a first source/drain layer 95 in the region 50N is epitaxially grown in the recesses. A second source/drain layer 97 is conformally formed over the first source/drain layer 95 using a process such as CVD, ALD, or the like and act as a sacrificial layer or etch stop layer, similar to the fourth source/drain layer 96, discussed above. The source/drain regions 98B comprise the first source/drain layer 95 in combination with the second source/drain layer 97. The source/drain regions 98B may include any acceptable material, such as appropriate for n-type FinFETs. For example, if the fin 52 is silicon, the source/drain regions 98B in the region 50N may include materials exerting a tensile strain in the channel region 58, such as silicon, SiC, SiCP, SiP, or the like. The source/drain regions 98B in the region 50N may have surfaces raised from respective surfaces of the fins 52 and may have facets.

The source/drain regions 98B and/or the fins 52 may be implanted with dopants to form source/drain regions, similar to the process previously discussed for forming lightly-doped source/drain regions, followed by an anneal. The source/drain regions may have an impurity concentration of about $10^{19}$ cm$^{-3}$ to about $10^{21}$ cm$^{-3}$. The n-type impurities for the source/drain regions 98B may be any of the impurities previously discussed. In some embodiments, the source/drain regions 98B may be in situ doped during growth.

As a result of the epitaxy processes used to form the source/drain regions 98B in the region 50N, upper surfaces of the source/drain regions 98B have facets which expand laterally outward beyond sidewalls of the fins 52. In some embodiments, these facets cause adjacent source/drain regions 98B of a same FinFET to merge as illustrated by FIG. 15B. In other embodiments (not separately illustrated), adjacent source/drain regions 98B remain separated after the epitaxy process is completed.

Major surfaces of the source/drain regions 98A and the source/drain regions 98B may have crystalline planes in the (100) plane in the cross-section A-A, as illustrated in FIGS. 14A and 15A. Major surfaces of the source/drain regions 98A and the source/drain regions 98B may have crystalline planes in the (111) plane in the cross-section B-B, as illustrated in FIGS. 14B and 15B.

In FIGS. 16A and 16B, a first ILD 100 is deposited over the structure illustrated in FIGS. 14A-15B. The first ILD 100 may be formed of a dielectric material, and may be deposited by any suitable method, such as CVD, plasma-enhanced CVD (PECVD), or FCVD. Dielectric materials may include phosphosilicate glass (PSG), borosilicate glass (BSG), boron-doped phosphosilicate glass (BPSG), undoped silicate glass (USG), or the like. Other insulation materials formed by any acceptable process may be used. In some embodiments, a contact etch stop layer (CESL) 101 is disposed between the first ILD 100 and the source/drain regions 98A and 98B, the masks 74, and the gate spacers 86. The CESL 101 may comprise a dielectric material, such as, silicon nitride, silicon oxide, silicon oxynitride, or the like, having a different etch rate than the material of the overlying first ILD 100.

Figure 17A:
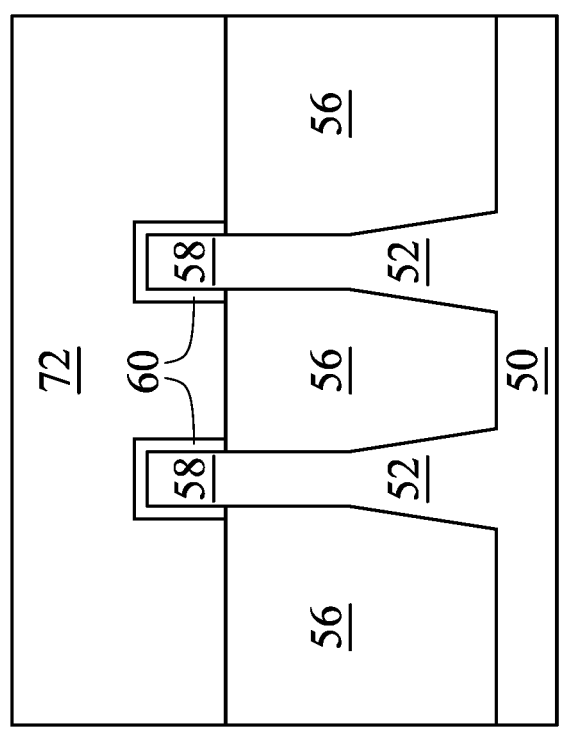
FIGS. 17A and 17B illustrate cross-sectional views of a planarization of the first inter-layer dielectric layer, the mask, the gate seal spacers, and the gate spacers, in accordance with some embodiments.
Figure 17B:
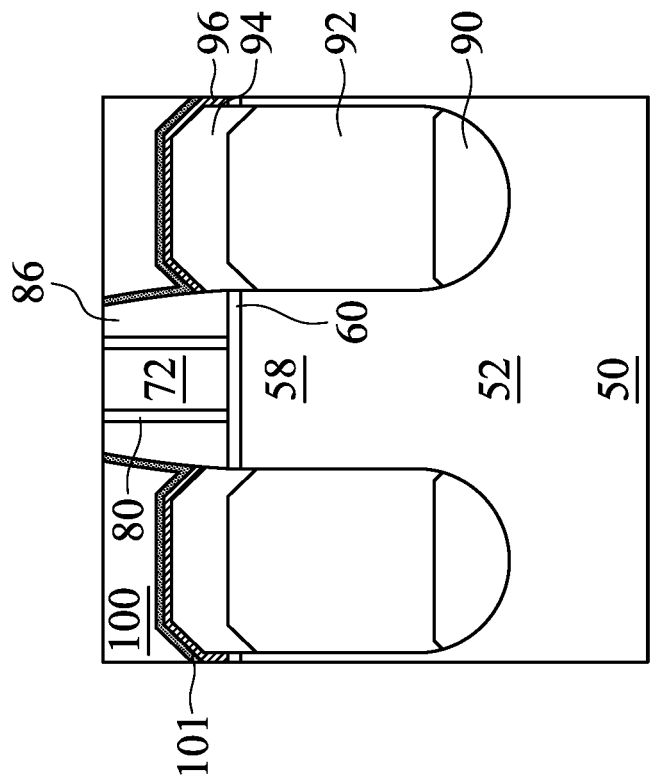

In FIGS. 17A and 17B, a planarization process, such as a CMP, may be performed to level the top surface of the first ILD 100 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 100 are level. Accordingly, the top surfaces of the dummy gates 72 are exposed through the first ILD 100. In some embodiments, the masks 74 may remain, in which case the planarization process levels the top surface of the first ILD 100 with the top surfaces of the top surface of the masks 74.

In FIGS. 18A and 18B, the dummy gates 72, and the masks 74 if present, are removed in an etching step(s), so that recesses 102 are formed. Portions of the dummy dielectric layer 60 in the recesses 102 may also be removed. In some embodiments, only the dummy gates 72 are removed and the dummy dielectric layer 60 remains and is exposed by the recesses 102. In some embodiments, the dummy dielectric layer 60 is removed from recesses 102 in a first region of a die (e.g., a core logic region) and remains in recesses 102 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 100 or the gate spacers 86. Each recess 102 exposes a channel region 58 of a respective fin 52. Each channel region 58 is disposed between neighboring pairs of the source/drain regions 98A and the source/drain regions 98B. During the removal, the dummy dielectric layer 60 may be used as an etch stop layer when the dummy gates 72 are etched. The dummy dielectric layer 60 may then be optionally removed after the removal of the dummy gates 72.

Figure 19B:
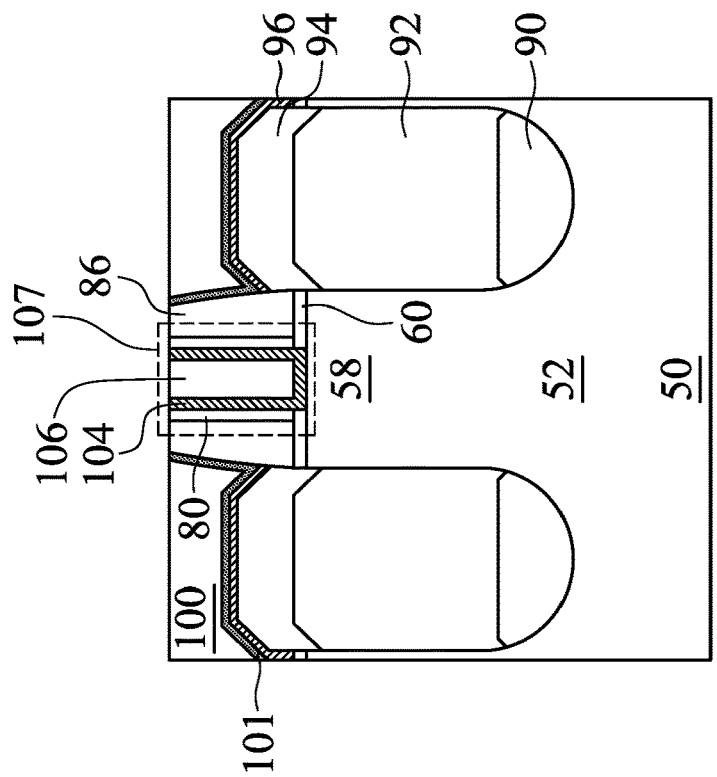
FIGS. 19A-19C illustrate cross-sectional views of a formation of gate stacks, in accordance with some embodiments.
Figure 19A:
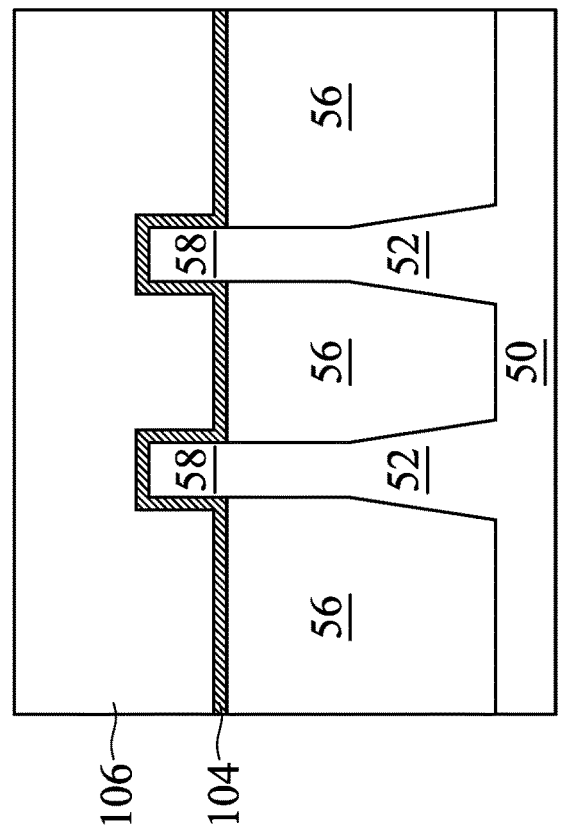
Figure 19C:
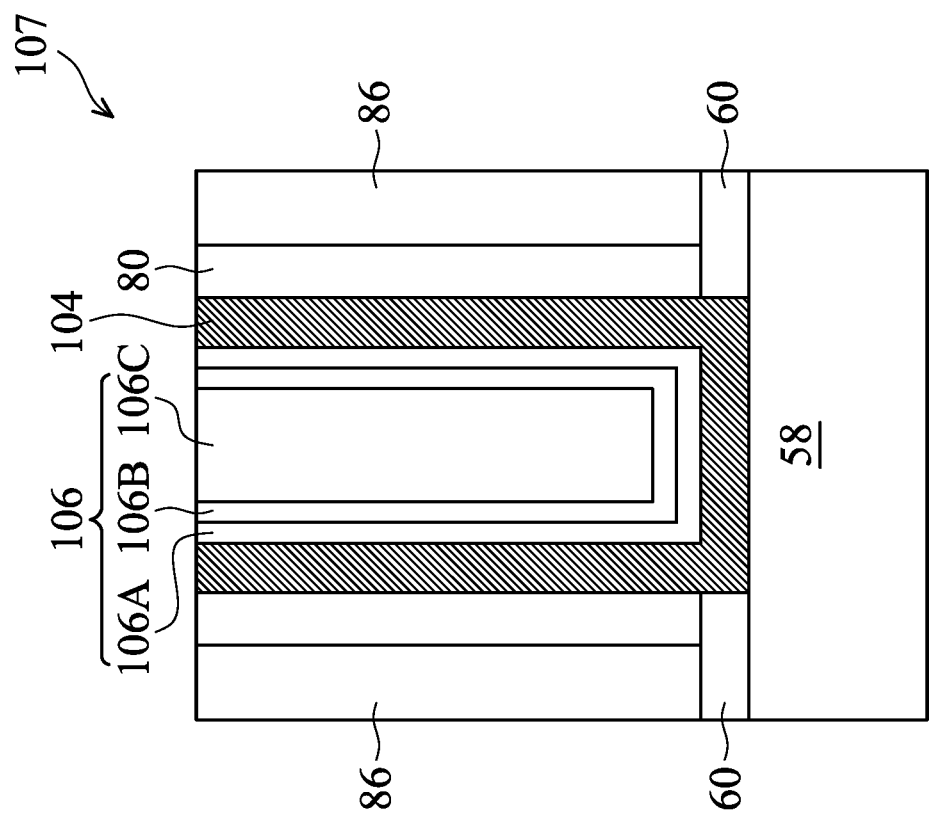

In FIGS. 19A and 19B, gate dielectric layers 104 and gate electrodes 106 are formed for replacement gates. FIG. 19C illustrates a detailed view of region 107 of FIG. 19B. Gate dielectric layers 104 are deposited conformally in the recesses 102, such as on the top surfaces and the sidewalls of the fins 52 and on sidewalls of the gate seal spacers 80/gate spacers 86. The gate dielectric layers 104 may also be formed on top surface of the first ILD 100. In accordance with some embodiments, the gate dielectric layers 104 comprise silicon oxide, silicon nitride, or multilayers thereof. In some embodiments, the gate dielectric layers 104 include a high-k dielectric material, and in these embodiments, the gate dielectric layers 104 may have a k value greater than about 7.0, and may include a metal oxide or a silicate of Hf, Al, Zr, La, Mg, Ba, Ti, Pb, and combinations thereof. The formation methods of the gate dielectric layers 104 may include molecular-beam deposition (MBD), ALD, PECVD, and the like. In embodiments where portions of the dummy dielectric layer 60 remains in the recesses 102, the gate dielectric layers 104 include a material of the dummy dielectric layer 60 (e.g., $SiO_2$).

The gate electrodes 106 are deposited over the gate dielectric layers 104, respectively, and fill the remaining portions of the recesses 102. The gate electrodes 106 may include a metal-containing material such as TiN, TiO, TaN, TaC, Co, Ru, Al, W, combinations thereof, or multilayers thereof. For example, although a single layer gate electrode 106 is illustrated in FIG. 19B, the gate electrode 106 may comprise any number of liner layers 106A, any number of work function tuning layers 106B, and a fill material 106C as illustrated by FIG. 19C. After the filling of the gate electrodes 106, a planarization process, such as a CMP, may be performed to remove the excess portions of the gate dielectric layers 104 and the material of the gate electrodes 106, which excess portions are over the top surface of the first ILD 100. The remaining portions of material of the gate electrodes 106 and the gate dielectric layers 104 thus form replacement gates of the resulting FinFETs. The gate electrodes 106 and the gate dielectric layers 104 may be collectively referred to as a "gate stack." The gate and the gate stacks may extend along sidewalls of a channel region 58 of the fins 52.

The formation of the gate dielectric layers 104 in the region 50N and the region 50P may occur simultaneously such that the gate dielectric layers 104 in each region are formed from the same materials, and the formation of the gate electrodes 106 may occur simultaneously such that the gate electrodes 106 in each region are formed from the same materials. In some embodiments, the gate dielectric layers 104 in each region may be formed by distinct processes, such that the gate dielectric layers 104 may be different materials, and/or the gate electrodes 106 in each region may be formed by distinct processes, such that the gate electrodes 106 may be different materials. Various masking steps may be used to mask and expose appropriate regions when using distinct processes.

Figure 20B:
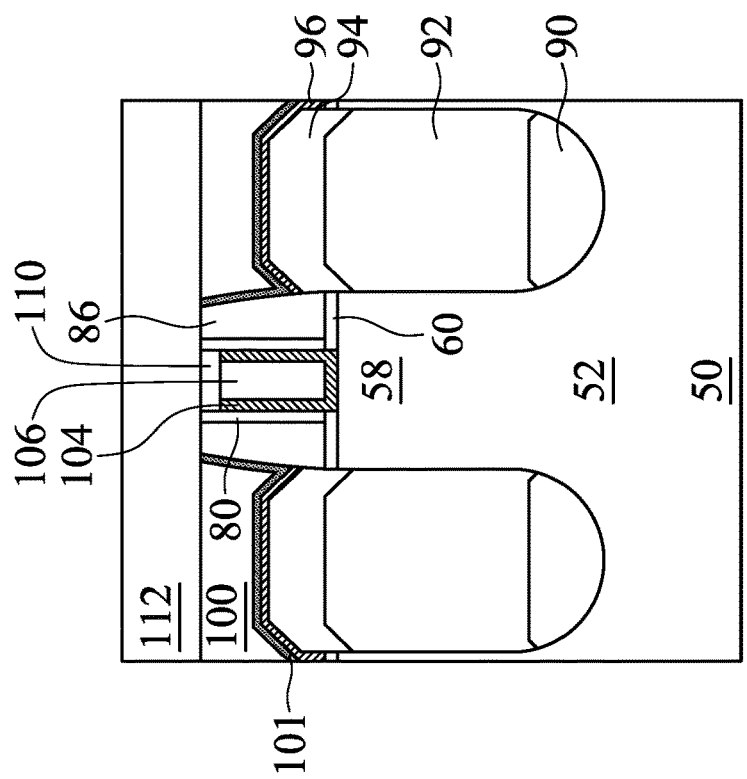
FIGS. 20A and 20B illustrate cross-sectional views of a formation of a second inter-layer dielectric layer, in accordance with some embodiments.
Figure 20A:
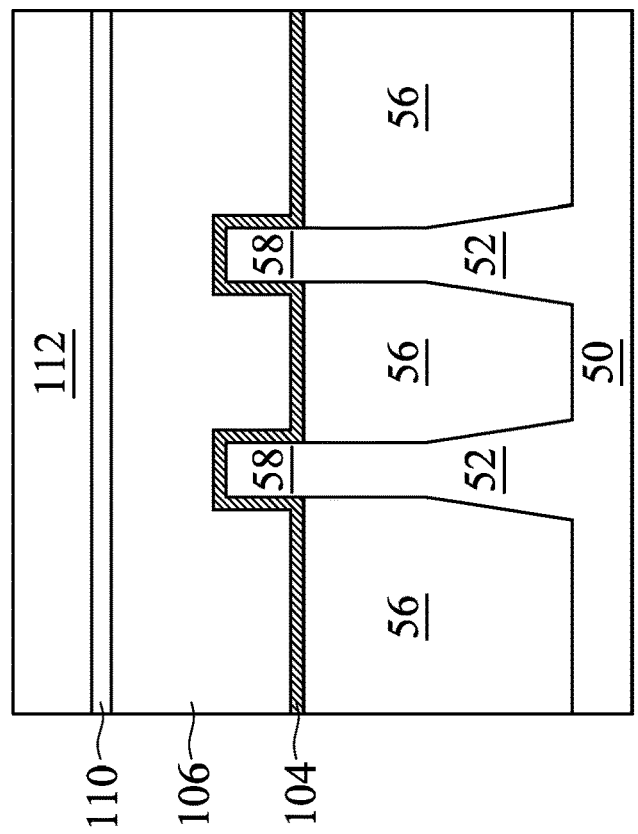

In FIGS. 20A and 20B, a second ILD 112 is deposited over the first ILD 100. In some embodiment, the second ILD 112 is a flowable film formed by a flowable CVD method. In some embodiments, the second ILD 112 is formed of a dielectric material such as PSG, BSG, BPSG, USG, or the like, and may be deposited by any suitable method, such as CVD and PECVD. In accordance with some embodiments, before the formation of the second ILD 112, the gate stack (including a gate dielectric layer 104 and a corresponding overlying gate electrode 106) is recessed, so that a recess is formed directly over the gate stack and between opposing portions of gate spacers 86, as illustrated in FIGS. 20A and 20B. A gate mask 110 comprising one or more layers of dielectric material, such as silicon nitride, silicon oxynitride, or the like, is filled in the recess, followed by a planarization process to remove excess portions of the dielectric material extending over the first ILD 100. The subsequently formed gate contacts 114 (FIGS. 21A-21C) penetrate through the gate mask 110 to contact the top surface of the recessed gate electrode 106.

Figure 21B:
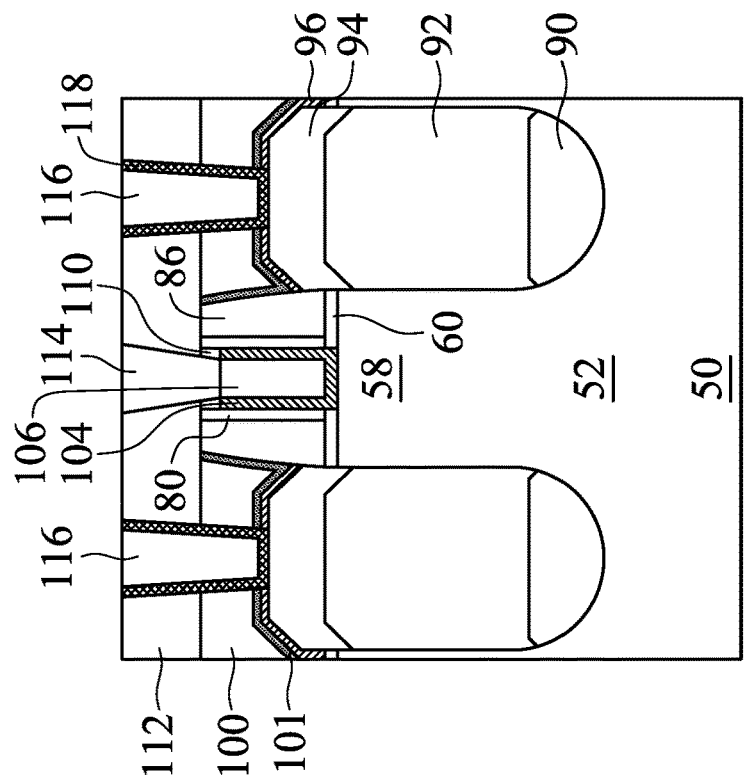
FIGS. 21A-21C illustrate cross-sectional views of a formation of a gate contact and source/drain contacts, in accordance with some embodiments.
Figure 21A:
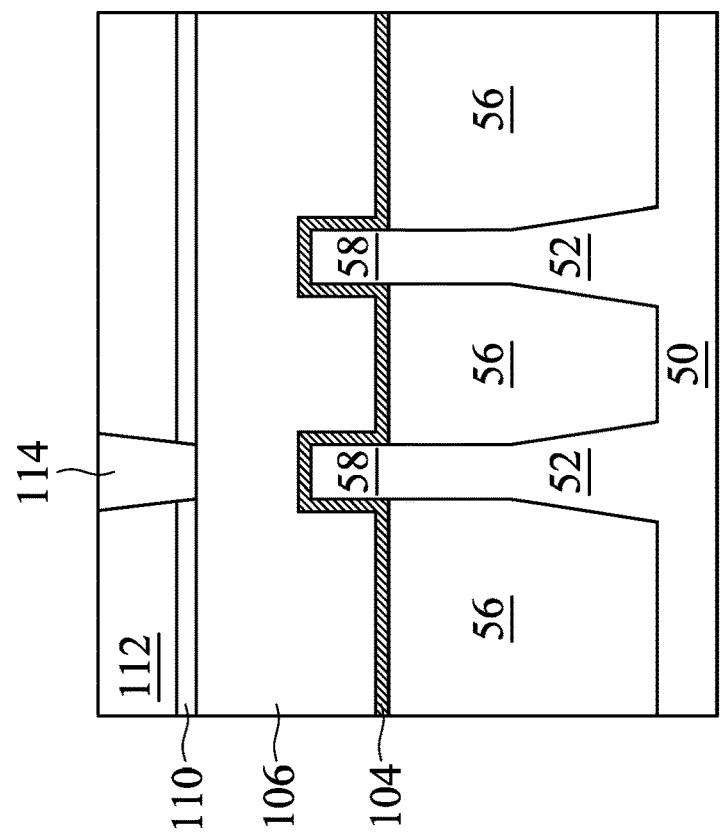
Figure 21C:
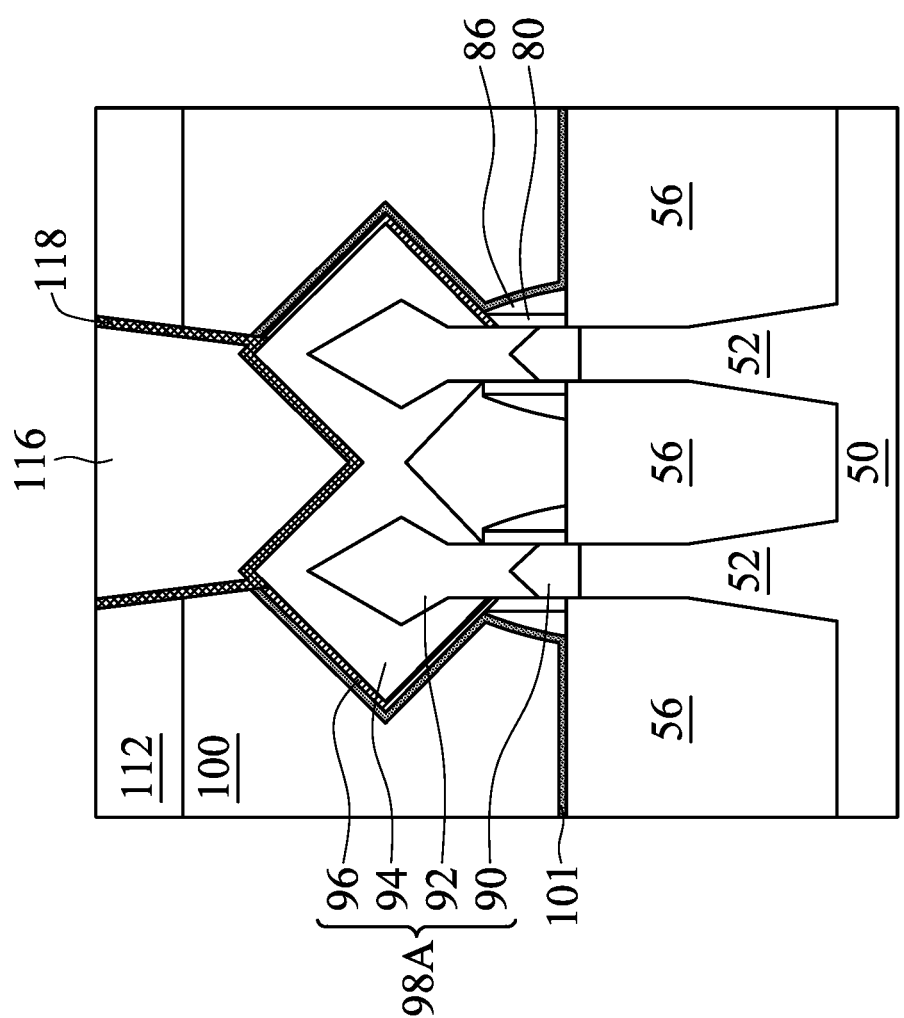

In FIGS. 21A-21C, gate contacts 114 and source/drain contacts 116 are formed through the second ILD 112 and the first ILD 100 in accordance with some embodiments. Openings for the source/drain contacts 116 are formed through the first ILD 100, the second ILD 112, and the fourth source/drain layer 96 or the second source/drain layer 97 (not separately illustrated), and openings for the gate contacts 114 are formed through the second ILD 112 and the gate mask 110. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 112. The remaining liner and conductive material form the source/drain contacts 116 and the gate contacts 114 in the openings. As illustrated in FIGS. 21B and 21C, an anneal process may be performed to form a silicide 118 at the interface between the source/drain regions 98A and the source/drain contacts 116 and at the interface between the source/drain regions 98B and the source/drain contacts 116. The source/drain contacts 116 are physically and electrically coupled to the source/drain regions 98A and the source/drain regions 98B, and the gate contacts 114 are physically and electrically coupled to the gate electrodes 106. The source/drain contacts 116 and gate contacts 114 may be formed in different processes, or may be formed in the same process. Although shown as being formed in the same cross-sections, it should be appreciated that each of the source/drain contacts 116 and gate contacts 114 may be formed in different cross-sections, which may avoid shorting of the contacts.

As described above, the source/drain regions 98A may have increased waviness (e.g., an increased height difference between top surfaces of the source/drain regions 98A and a valley between merged source/drain regions 98A), a decreased volume, and increased concentrations of germanium and doped ions. Semiconductor devices including the source/drain regions 98A have reduced channel resistance $R_{ch}$, reduced source/drain resistance $R_{sd}$, improved device performance $I_{on}$, reduced gate-to-drain capacitance, reduced RC delay, and boosted device speed.

In accordance with an embodiment, a method includes etching one or more semiconductor fins to form one or more recesses; and forming source/drain regions in the one or more recesses, the forming the source/drain regions including epitaxially growing a first semiconductor material in the one or more recesses at a temperature of 600° C. to 800° C., the first semiconductor material including doped silicon germanium; and conformally depositing a second semiconductor material over the first semiconductor material at a temperature of 300° C. to 600° C., the second semiconductor material including doped silicon germanium and having a different composition than the first semiconductor material. In an embodiment, the one or more recesses include a first recess and a second recess, the first semiconductor material in the first recess merging with the first semiconductor material in the second recess during the epitaxially growing the first semiconductor material. In an embodiment, the first semiconductor material includes silicon germanium having an atomic percentage of germanium of 40 to 50 percent and a boron concentration of greater than $6\times10^{20}$ atoms/cm$^3$. In an embodiment, the one or more recesses includes a first recess and a second recess, the second semiconductor material over the first recess merging with the second semiconductor material over the second recess during the conformally depositing the second semiconductor material. In an embodiment, the second semiconductor material includes silicon germanium having an atomic percentage of germanium of 60 to 80 percent and a boron concentration of greater than $8\times10^{20}$ atoms/cm$^3$. In an embodiment, the first semiconductor material is epitaxially grown at a pressure of 5 Torr to 50 Torr, and the second semiconductor material is conformally deposited at a pressure of greater than 20 Torr. In an embodiment, the epitaxially growing the first semiconductor material includes epitaxially growing a first semiconductor layer in the one or more recesses, the first semiconductor layer having a thickness of 1 nm to 10 nm, the first semiconductor layer including a germanium concentration of 20 to 40 atomic percent, the first semiconductor layer including a boron dopant concentration of less than $5\times10^{20}$ atoms/cm$^3$; and epitaxially growing a second semiconductor layer over and in contact with the first semiconductor layer, the second semiconductor layer having a thickness of less than 25 nm, the second semiconductor layer including a germanium concentration of 40 to 50 atomic percent, the second semiconductor layer including a boron dopant concentration of greater than $6\times10^{20}$ atoms/cm$^3$. In an embodiment, the conformally depositing the second semiconductor material includes conformally depositing a third semiconductor layer over and in contact with the second semiconductor layer, the third semiconductor layer having a thickness of greater than 20 nm, the third semiconductor layer including a germanium concentration of 60 to 80 atomic percent, the third semiconductor layer including a boron dopant concentration of greater than $8\times10^{20}$ atoms/cm$^3$; and conformally depositing a fourth semiconductor layer over and in contact with the third semiconductor layer, the fourth semiconductor layer having a thickness of less than 10 nm, the fourth semiconductor layer including a germanium concentration of less than 40 atomic percent, the fourth semiconductor layer including a boron dopant concentration of greater than $1\times10^{20}$ atoms/cm$^3$.

In accordance with another embodiment, a device includes a fin extending from a substrate; a gate stack over the fin; at least one source/drain region in the fin adjacent the gate stack, the at least one source/drain region including a first source/drain material having a germanium concentration of 30 to 50 atomic percent and having a thickness of less than 30 nm; and a second source/drain material over the first source/drain material, the second source/drain material having a germanium concentration of 50 to 80 atomic percent and having a thickness of greater than 10 nm; and a source/drain contact contacting the at least one source/drain region. In an embodiment, the first source/drain material includes a first source/drain layer and a second source/drain layer over the first source/drain layer, the first source/drain layer having a germanium concentration of 30 to 40 atomic percent and having a thickness of 1 to 10 nm, the second source/drain layer having a germanium concentration of 40 to 50 atomic percent and a thickness of less than 25 nm. In an embodiment, the first source/drain layer has a dopant ion concentration of less than $5\times10^{20}$ atoms/cm$^3$, the second source/drain layer has a dopant ion concentration of greater than $6\times10^{20}$ atoms/cm$^3$, and the second source/drain material has a dopant ion concentration of greater than $8\times10^{20}$ atoms/cm$^3$. In an embodiment, the device further includes a third source/drain material over the second source/drain material, the third source/drain material having a germanium concentration of less than 40 atomic percent and a thickness of less than 10 nm. In an embodiment, the device further includes a source/drain contact extending through the third source/drain material to physically contact to second source/drain material. In an embodiment, the at least one source/drain region includes a first source/drain region and a second source/drain region and the first source/drain material of the first source/drain region is merged with the first source/drain material of the second source/drain region. In an embodiment, the at least one source/drain region includes a first source/drain region and a second source/drain region and the second source/drain material of the first source/drain region is merged with the second source/drain material of the second source/drain region. In an embodiment, the second source/drain material includes a valley between the first source/drain region and the second source/drain region and a first height measured vertically between a topmost surface of the first source/drain region and the valley is greater than 5 nm.

In accordance with yet another embodiment, a method includes etching a fin to form first openings, the fin extending from a substrate; forming source/drain regions in the first openings, the forming the source/drain regions includes epitaxially growing a first semiconductor material in the first openings at a pressure of 5 Torr to 50 Torr, the first semiconductor material having a dopant ion concentration of less than $5\times10^{20}$ atoms/cm$^3$; epitaxially growing a second semiconductor material over the first semiconductor material at a pressure of 5 Torr to 50 Torr, the second semiconductor material having a dopant ion concentration of greater than $6\times10^{20}$ atoms/cm$^3$; and conformally depositing a third semiconductor material over the second semiconductor material at a pressure of less than 20 Torr, the third semiconductor material having a dopant ion concentration of greater than $8\times10^{20}$ atoms/cm$^3$; forming an inter-layer dielectric over the source/drain region; etching the inter-layer dielectric to form a second opening exposing the third semiconductor material; and forming a source/drain contact extending through the second opening to contact the third semiconductor material. In an embodiment, the method further includes conformally depositing a fourth semiconductor material over the third semiconductor material at a pressure of less than 20 Torr, the fourth semiconductor material having a dopant ion concentration of greater than $1\times10^{20}$ atoms/cm$^3$. In an embodiment, the source/drain regions include a first source/drain region and a second source/drain region, the first source/drain region and the second source/drain region merging after the epitaxially growing the second semiconductor material. In an embodiment, the first source/drain region and the second source/drain region include facets, an angle between a first facet of the first source/drain region and a second facet of the second source/drain region intersecting the first facet being less than 90 degrees.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a fin extending from a substrate;
    a gate stack over the fin;
    a source/drain region in the fin adjacent the gate stack, the source/drain region comprising:
        a first source/drain layer having a germanium concentration of that is lower than 40 atomic percent and having a thickness of less than 10 nm;
        a second source/drain layer over the first source/drain layer, the second source/drain layer having a germanium concentration of 40 to 50 atomic percent and having a thickness that is less than 25 nm;
        a third source/drain layer over the second source/drain layer, the third source/drain layer having a germanium concentration of 60 to 80 atomic percent;
        a fourth source/drain layer over the third source/drain layer, the fourth source/drain layer having a germanium concentration that is less than 40 atomic percent, wherein each of the first source/drain layer, the second source/drain layer, the third source/drain layer and the fourth source/drain layer comprise facets, and wherein a topmost point of the first source/drain layer is lower than a bottommost point of the third source/drain layer and a bottommost point of the fourth source/drain layer; and
    a source/drain contact contacting the source/drain region.

2. The device of claim 1, wherein the first source/drain layer has a dopant concentration of less than $5\times10^{20}$ atoms/cm$^3$.

3. The device of claim 2, wherein the second source/drain layer has a dopant concentration of greater than $6\times10^{20}$ atoms/cm$^3$, and wherein the third source/drain layer has a dopant concentration of greater than $8\times10^{20}$ atoms/cm$^3$.

4. The device of claim 1, wherein a width of a topmost surface of the source/drain contact is greater than a width of a bottommost surface of the source/drain contact.

5. The device of claim 4, further comprising the source/drain contact extending completely through the fourth source/drain layer to physically contact the third source/drain layer.

6. A device comprising:
    a gate stack over and along sidewalls of a first semiconductor fin; and
    a source/drain region adjacent the gate stack, the source/drain region comprising:
        a first source/drain layer having a germanium concentration in a range from 20 atomic percent to 40 atomic percent;
        a second source/drain layer over the first source/drain layer, the second source/drain layer having a germanium concentration in a range from 40 atomic percent to 50 atomic percent;
        a third source/drain layer over the second source/drain layer, the third source/drain layer having a germanium concentration in a range from 60 atomic percent to 80 atomic percent; and
        a fourth source/drain layer over the third source/drain layer, the fourth source/drain layer having a germanium concentration that is less than 40 atomic percent, wherein each of the first source/drain layer, the second source/drain layer, the third source/drain layer and the fourth source/drain layer comprise facets, and wherein a bottommost point of the third source/drain layer and a bottommost point of the fourth source/drain layer are higher than a topmost point of the first source/drain layer.

7. The device of claim 6, further comprising a source/drain contact extending through the fourth source/drain layer to physically contact the third source/drain layer.

8. The device of claim 6, wherein the source/drain region comprises:
    a first portion in the first semiconductor fin; and
    a second portion in a second semiconductor fin adjacent the first semiconductor fin, wherein the third source/drain layer of the first portion is merged with the third source/drain layer of the second portion.

9. The device of claim 8, wherein the third source/drain layer comprises a valley between the first portion of the source/drain region and the second portion of the source/drain region.

10. The device of claim 9, wherein a distance between a topmost surface of the source/drain region and a bottommost point of the valley is greater than 5 nm.

11. The device of claim 9, wherein a distance between a bottommost point of an inner facet of the merged third source/drain layer and a bottom of the first semiconductor fin is greater than 25 nm.

12. The device of claim 9, wherein an angle between intersecting facets at a top surface of the source/drain region is less than 90 degrees.

13. The device of claim 6, wherein the third source/drain layer has a dopant concentration greater than $8\times10^{20}$ atoms/cm$^3$, and wherein the fourth source/drain layer has a dopant concentration greater than $1\times10^{20}$ atoms/cm$^3$.

14. A device comprising:
    a fin protruding from a substrate;
    a gate stack over a top surface and sidewalls of the fin; and
    a source/drain region in the fin, wherein the source/drain region comprises:
        a first semiconductor material having a dopant concentration of less than $5\times10^{20}$ atoms/cm$^3$;

a second semiconductor material over the first semiconductor material, the second semiconductor material having a dopant concentration greater than $6 \times 10^{20}$ atoms/cm$^3$; and a third semiconductor material over the second semiconductor material, the third semiconductor material having a dopant concentration greater than $8 \times 10^{20}$ atoms/cm$^3$, wherein a first angle between intersecting facets at a top surface of the third semiconductor material is smaller than 90 degrees and larger than a second angle between intersecting facets at a top surface of the second semiconductor material, wherein the first angle is higher than and overlaps the second angle.

15. The device of claim 14, further comprising:
a fourth semiconductor material over the third semiconductor material, wherein the fourth semiconductor material has a thickness of less than 10 nm; and
a source/drain contact extending through the fourth semiconductor material and in physical contact with the third semiconductor material.

16. The device of claim 14, wherein a thickness of the first semiconductor material is in a range from 1 nm to 10 nm, and wherein the first semiconductor material has a germanium concentration that is in a range from 20 atomic percent to 40 atomic percent.

17. The device of claim 14, wherein a thickness of the second semiconductor material is less than 25 nm, and wherein the second semiconductor material has a germanium concentration that is in a range from 40 to 50 atomic percent.

18. The device of claim 1, wherein a height between a bottom surface of an outer facet of the source/drain region and a bottom of the fin is greater than 20 nm.

19. The device of claim 1, wherein a major surface of the source/drain region in a first cross-section has a crystalline plane in the (100) plane.

20. The device of claim 19, wherein a major surface of the source/drain region in a second cross-section has a crystalline plane in the (iii) plane, and wherein the first cross-section is different from the second cross-section.

* * * * *

UNITED STATES PATENT AND TRADEMARK OFFICE
CERTIFICATE OF CORRECTION

| | |
|---|---|
| PATENT NO. | : 12,002,854 B2 |
| APPLICATION NO. | : 17/520983 |
| DATED | : June 4, 2024 |
| INVENTOR(S) | : Heng-Wen Ting et al. |

It is certified that error appears in the above-identified patent and that said Letters Patent is hereby corrected as shown below:

In the Claims

In Column 20, Line 19, Claim No. 20:
Change "line plane in the (iii) plane, and wherein the first cross-" to --fine plane in the (111) plane, and wherein the first cross--

Signed and Sealed this
Sixteenth Day of July, 2024

Katherine Kelly Vidal
Director of the United States Patent and Trademark Office